(12) United States Patent
Raphael

(10) Patent No.: US 8,775,141 B2
(45) Date of Patent: Jul. 8, 2014

(54) SYSTEM AND METHOD FOR PERFORMING OILFIELD SIMULATION OPERATIONS

(75) Inventor: Scott Trevor Raphael, Calgary (CA)

(73) Assignee: Schlumberger Technology Corporation, Houston, TX (US)

(*) Notice: Subject to any disclaimer, the term of this patent is extended or adjusted under 35 U.S.C. 154(b) by 1279 days.

(21) Appl. No.: 12/167,069

(22) Filed: Jul. 2, 2008

(65) Prior Publication Data

US 2009/0012765 A1 Jan. 8, 2009

Related U.S. Application Data

(63) Continuation-in-part of application No. 11/929,921, filed on Oct. 30, 2007, now Pat. No. 8,352,227, and a continuation-in-part of application No. 11/929,811, filed on Oct. 30, 2007.

(60) Provisional application No. 60/958,208, filed on Jul. 2, 2007.

(51) Int. Cl.
*G06G 7/48* (2006.01)

(52) U.S. Cl.
USPC .......................................................... 703/10

(58) Field of Classification Search
USPC .......................................................... 703/10
See application file for complete search history.

(56) References Cited

U.S. PATENT DOCUMENTS

| | | | |
|---|---|---|---|
| 4,676,313 A | 6/1987 | Rinaldi | |
| 5,992,519 A | 11/1999 | Ramakrishnan et al. | |
| 6,018,497 A | 1/2000 | Gunasekera et al. | |
| 6,078,869 A | 6/2000 | Gunasekera et al. | |
| 6,106,561 A | 8/2000 | Farmer et al. | |
| 6,178,815 B1 | 1/2001 | Felling et al. | |
| 6,230,101 B1 | 5/2001 | Wallis | |
| 6,266,619 B1 | 7/2001 | Thomas et al. | |
| 6,313,837 B1 | 11/2001 | Assa et al. | |
| 6,356,844 B2 | 3/2002 | Thomas et al. | |
| 6,775,578 B2 | 8/2004 | Couet et al. | |
| 6,836,731 B1 | 12/2004 | Whalley et al. | |
| 6,853,921 B2 | 2/2005 | Thomas et al. | |
| 6,892,812 B2 | 5/2005 | Niedermayr | |

(Continued)

FOREIGN PATENT DOCUMENTS

| | | |
|---|---|---|
| EP | 1984860 A2 | 10/2008 |
| GB | 2336008 A1 | 10/1999 |

(Continued)

OTHER PUBLICATIONS

L. Lo et al., "WAG pilot design and observation well data analysis for hassi berkine south field," 2003, Society of Petroleum Engineers paper SPE 84076, pp. 1-15.*

(Continued)

*Primary Examiner* — Kamini S Shah
*Assistant Examiner* — Russ Guill

(57) ABSTRACT

The invention relates to a method of simulating operations of an oilfield, which has process facilities and wellsite operatively connected, each wellsite having a wellbore penetrating a subterranean formation for extracting fluid from an underground reservoir. The method steps include selecting simulators for modeling the oilfield with at least one of the simulators having functionality to model fluid injection, selectively coupling each of the simulators according to a predefined configuration, and modeling an injection operation of the oilfield by selectively communicating between the simulators.

14 Claims, 10 Drawing Sheets

(56) References Cited

U.S. PATENT DOCUMENTS

| | | | |
|---|---|---|---|
| 6,931,621 | B2 | 8/2005 | Green et al. |
| 6,937,621 | B2 | 8/2005 | Samrao et al. |
| 6,980,940 | B1 | 12/2005 | Gurpinar |
| 7,079,952 | B2 | 7/2006 | Thomas et al. |
| 7,107,188 | B2 | 9/2006 | Veneruso et al. |
| 7,164,990 | B2 | 1/2007 | Bratvedt et al. |
| 7,752,023 | B2* | 7/2010 | Middya ............................ 703/10 |
| 2002/0013687 | A1 | 1/2002 | Ortoleva |
| 2002/0188537 | A1 | 12/2002 | Leeds et al. |
| 2003/0132934 | A1 | 7/2003 | Fremming |
| 2003/0155111 | A1 | 8/2003 | Vinegar et al. |
| 2003/0216897 | A1 | 11/2003 | Endres et al. |
| 2003/0225606 | A1 | 12/2003 | Raghuraman |
| 2004/0015295 | A1 | 1/2004 | Bratvedt et al. |
| 2004/0133290 | A1 | 7/2004 | Noble et al. |
| 2004/0220790 | A1 | 11/2004 | Cullick et al. |
| 2004/0220846 | A1 | 11/2004 | Cullick et al. |
| 2004/0268338 | A1 | 12/2004 | Gurpinar et al. |
| 2005/0114031 | A1 | 5/2005 | Thambynayagam et al. |
| 2005/0122001 | A1 | 6/2005 | Ma et al. |
| 2005/0149307 | A1 | 7/2005 | Gurpinar et al. |
| 2006/0129366 | A1 | 6/2006 | Shaw |
| 2006/0184329 | A1 | 8/2006 | Rowan et al. |
| 2006/0197759 | A1 | 9/2006 | Fremming |
| 2007/0061087 | A1 | 3/2007 | Ghorayeb et al. |
| 2007/0112547 | A1 | 5/2007 | Ghorayeb et al. |
| 2007/0179767 | A1 | 8/2007 | Cullick et al. |
| 2007/0198223 | A1* | 8/2007 | Ella et al. ...................... 702/188 |
| 2007/0272407 | A1 | 11/2007 | Lehman et al. |
| 2008/0133550 | A1 | 6/2008 | Orangi et al. |
| 2009/0216508 | A1 | 8/2009 | Dale et al. |

FOREIGN PATENT DOCUMENTS

| | | |
|---|---|---|
| WO | 96/64896 A | 12/1999 |
| WO | 0106091 A1 | 1/2001 |
| WO | 2004/049216 A1 | 6/2004 |
| WO | 2004046503 | 6/2004 |
| WO | 200512001 A1 | 12/2005 |
| WO | 2007/089829 | 8/2007 |
| WO | 2009006526 A2 | 1/2009 |

OTHER PUBLICATIONS

M.J. Watson et al., "Integrated flow-assurance modeling of the BP Angola block 18 western area development," Jun. 2007, Society of Petroleum Engineers, pp. 1-12.*

C.C. Barroux et al., "Linking reservoir and surface simulators: how to improve the coupled solutions," 2000, Society of Petroleum Engineers, SPE 65159, pp. 1-14.*

International Search Report for International Application No. PCT/US2007/083072, dated Apr. 14, 2008, 3 pages.

Written Opinion for International Application No. PCT/US2007/083072, dated Apr. 14, 2008, 5 pages.

Ghorayeb, K, et al., Field Planning Using Intergrated Surface/Subsurface Modeling, 14th SPE Middle East Oil & Gas Show and Conference, SPE 92381, Mar. 12-15, 2005, 9 pages, Bahrain.

Liao, T. T. and Stein, M. H., Evaluating Operation Strategies via Intergrated Asset Modeling, SPE Gas Technology Symposium, SPE 75525, Apr. 30-May 2, 2002, 10 pages, Canada.

Crerar, A and Robertson, A. Uncertainity and Value in Intergrated Asset Modelling, presentation at Offshore Europe, SPE 96636, Sep. 6-9, 2005, 8 pages, Scotland.

Tjahvadi, R., KLX/KLY Reservoir Management Using Integrated Asset Modeling, Case Study, Asia Pacific Oil and Gas Conference and Exhibition, SPE 88602, Oct. 18-20, 2004, 5 pages, Australia.

Guyaguler, B. and Ghorayeb, K. Intergrated Optimization of Field Development, Planning and Operation, SPE Annual Technical Conference and Exhibition, SPE 102557, Sep. 24-27, 2006, 13 pages, USA.

Soma, R., et al., A Service-Oriented Data-Composition Architecture for Intergrated Asset Management,Intelligent Energy Conference and Exhibition, SPE 99983. Apr. 11-13, 2006, 8 pages, Amsterdam.

Begg, S. H., Bratvold, R. B., and Campbell, J. M., Improving Investment Decisions Using a Stochastic Intergrated Asset Model, Annual Technical Conference and Exhibition, SPE 71414, Sep. 30-Oct. 3, 2011, 16 pages, USA.

Liao, T. T., et al., Development and Applications of Sustaining Intergrated Asset Modeling Tool, 11th International Petroleum Exhibition and Conference, SPE 88748, Oct. 10-13, 2004, 8 pages, Abu Dhabi.

Janele, P. T., Galvin, T. J., and Kisucky, M. J., Integrated Asset Management; Work Process and Data Flow Models, Asia Pacific Conference on Integrated Modeling for Asset Management, SPE 39712, Mar. 23-24, 1998, 11 pages, Malaysia.

Kozman, J. B., "Why Can't I Just Start with a Map?"—Case Histories tor Integrated Asset Management, Asia Pacific Conference on Integrated Modeling for Asset Managment, SPE 87022, Mar. 29-30, 2004, 7 pages, Malaysia.

Ghorayeb, K. et al., A General Purpose Controller for Coupling Multiple Reservoir Simulations and Surface Facility Networks, Reservoir Simulation Symposium, SPE 79702, Feb. 3-5, 2003, 15 pages, USA.

Zhang, C., et al., Model-Based Framework for Oil Production Forecasting and Optimization: A Case Study in Intergrated Asset Management, SPE Intelligent Energy Conference and Exhibition, SPE 99979, Apr. 11-13, 2006, 7 pages, Amsterdam.

Wickens, L. M. And Jonge, D., Increasing Confidence in Production Forecasting Through Risk-Based Intergrated Asset Modelling, Captain Field Case Study, SPE Europed/EAGE Annual Conference and Exhibition, SPE 99937, Jun. 12-15, 2006, 12 pages, Austria.

Tobias, S., Thompson, D., and Ahmed, U., Intergratd Workflow Mehtodologies for Asset Teams, SPE Asia Pacific Conference on Intergrated Modeling for Asset Management, SPE 39736, Mar. 23-34, 1998, 4 pages, Malaysia.

El-Banbi, A. H., et al. An Integrated Approach to Optimizing a Large Asset, SPE Annual Technical Conference Exhibition, SPE 77674, Sep. 29-Oct. 2, 2002, 8 pages, USA.

Sutjahjo, A., et al., A Case Study: Maximizing Asset Value Through Intergrated Pipeline & Compression Optimization, SPE Asia Pacific Conference on Intergrated Modeling for Asset Managment, SPE 87040, Mar. 29-30, 2004, 9 pages, Malaysia.

Howell, A, Szatny, M., and Torrens, R., From Reservoir Through Process, From Today to Tomorrow-The Intergrated Asset Model, SPE Intelligent Energy Conference and Exhibition, SPE 99469, Apr. 11-13, 2006, 20 pages, Amsterdam.

Luciawaty, M., Intergrated Asset Modeling, A Quick Soulution for Indentifying an Infill Well Oppurtunity, SPE Asia Pacific Oil amd Gas Conference and Exhibition, SPE 88600, Oct. 18-20, 2004, 7 pages, Australia.

Acosta, L. M., et al. Intergrated Modeling of the El Furrial Field Assest Applying Rish and Uncertainty Analysis for the Decision Making, SPE Europec/EAGE Conference, SPE 94093, Jun. 13-16, 2005, 5 pages, Spain.

Rosales, A., et al. Future Exploitation Strategy Using Integrated Subsurface-to-Surface Methodology: Field Case Study-Litoral De Tabasco Asset, First International Oil Conference and Exhibition, SPE 104032, Aug. 31-Sep. 2, 2006, 15 pages, Mexico.

Schott, D. W., et al., Case History of Using an Integrated Asset Model for Depletion Planning of a Tight Gas Reservoir, Northeast Thompsonville Field, Jim Hogg and Webb Counties. Texas, SPE Annual Technical Conference and Exhibition, SPE 90519, Sep. 26-29, 2004, 9 pages, USA.

Landmark Graphics Corporation, DecisionSpace Producton, H04881, Mar. 2006, 4 pages.

Landmark Graphics Corporation, DecisionSpace Nexus, 2005, 4 pages, USA.

Schlumberger, Avocet Integrated Asset Modeier, 05-15-246, 2005, 4 pages.

Petroleum Experts LTD., IPM-GAP, Prosper, MBAL, PVTP, Reveal, Resolve- Engineering Software Development, Manual, 2004, 28 pages.

International Search Report from International Application No. PCT/US2007/083070, dated Apr. 22, 2008, 3 pages.

(56) References Cited

OTHER PUBLICATIONS

Written Opinion for International Application No. PCT/US2007/083070, dated Apr. 22, 2008, 4 pages.

Bangerth, et al., "An autonomic reservoir framework for the stochastic optimization of well placement", Cluster Computing, vol. 8, Oct. 2005, pp. 255-269.

Bieker, et al., "Real Time Production Optimization of Offshore Oil and Gas Production Systems: A Technology Survey", Society of Petroleum Engineers, SPE 99446, Apr. 2006, pp. 1-8.

Coats, et al., "A generalized wellbore and surface facility model, fully coupled to a reservoir simulator", SPE 87913, 2004, pp. 132-142.

Hepguler, et al., "Integration of a Field Surface and Production Network with a Reservoir Simulator", Society of Petroleum Engineers, SPE 38937, 1997, pp. 88-93.

Hayder, E. et al., "Production Optimization Through Coupled Facility/Reservoir Simulation", Society of Petroleum Engineers, SPE 100027, 2006, pp. 1-6.

Kosmala, et al., "Coupling of a surface network with reservoir simulation", SPE 84220, 2003, pp. 1-11.

Schiozer, Denis Jose, "Simultaneous Simulation of Reservoir and Surface Facilities", Stanford University, 1994, pp. 1-172.

Zapata, V.J. et al., "Advances in Tightly Coupled Reservoir/Wellbore/Surface-Network Simulation", Society of Petroleum Engineering, SPE 71120, 2001, pp. 114-120.

* cited by examiner

SYSTEM AND METHOD FOR PERFORMING OILFIELD SIMULATION OPERATIONS

CROSS REFERENCE TO RELATED APPLICATIONS

This application claims priority under 35 U.S.C. §119(e) from Provisional Patent Application Ser. No. 60/958,208 filed Jul. 2, 2007, and is a continuation-in-part application of U.S. Non-provisional patent application Ser. No. 11/929,811 and U.S. Non-provisional patent application Ser. No. 11/929,921, both filed Oct. 30, 2007.

BACKGROUND OF THE INVENTION

1. Field of the Invention

The present invention relates to techniques for performing oilfield operations relating to subterranean formations having reservoirs therein. More particularly, the invention relates to techniques for performing oilfield operations involving an analysis of reservoir operations, and their impact on such oilfield operations.

2. Background of the Related Art

Oilfield operations, such as surveying, drilling, wireline testing, completions, simulation, planning and oilfield analysis, are typically performed to locate and gather valuable downhole fluids. Various aspects of the oilfield and its related operations are shown in FIGS. 1A-1D. As shown in FIG. 1A, surveys are often performed using acquisition methodologies, such as seismic scanners to generate maps of underground structures. These structures are often analyzed to determine the presence of subterranean assets, such as valuable fluids or minerals. This information is used to assess the underground structures and locate the formations containing the desired subterranean assets. Data collected from the acquisition methodologies may be evaluated and analyzed to determine whether such valuable items are present, and if they are reasonably accessible.

As shown in FIG. 1B-1D, one or more wellsites may be positioned along the underground structures to gather valuable fluids from the subterranean reservoirs. The wellsites are provided with tools capable of locating and removing hydrocarbons from the subterranean reservoirs. As shown in FIG. 1B, drilling tools are typically advanced from the oil rigs and into the earth along a given path to locate the valuable downhole fluids. During the drilling operation, the drilling tool may perform downhole measurements to investigate downhole conditions. In some cases, as shown in FIG. 1C, the drilling tool is removed and a wireline tool is deployed into the wellbore to perform additional downhole testing.

After the drilling operation is complete, the well may then be prepared for production. As shown in FIG. 1D, wellbore completions equipment is deployed into the wellbore to complete the well in preparation for the production of fluid therethrough. Fluid is then drawn from downhole reservoirs, into the wellbore and flows to the surface. Production facilities are positioned at surface locations to collect the hydrocarbons from the wellsite(s). Fluid drawn from the subterranean reservoir(s) passes to the production facilities via transport mechanisms, such as tubing. Various equipment may be positioned about the oilfield to monitor oilfield parameters and/or to manipulate the oilfield operations.

During the oilfield operations, data is typically collected for analysis and/or monitoring of the oilfield operations. Such data may include, for example, subterranean formation, equipment, historical and/or other data. Data concerning the subterranean formation is collected using a variety of sources.

Such formation data may be static or dynamic. Static data relates to, for example, formation structure and geological stratigraphy that define the geological structure of the subterranean formation. Dynamic data relates to, for example, fluids flowing through the geologic structures of the subterranean formation over time. Such static and/or dynamic data may be collected to learn more about the formations and the valuable assets contained therein.

Sources used to collect static data may be seismic tools, such as a seismic truck that sends compression waves into the earth as shown in FIG. 1A. These waves are measured to characterize changes in the density of the geological structure at different depths. This information may be used to generate basic structural maps of the subterranean formation. Other static measurements may be gathered using core sampling and well logging techniques. Core samples may be used to take physical specimens of the formation at various depths as shown in FIG. 1B. Well logging typically involves deployment of a downhole tool into the wellbore to collect various downhole measurements, such as density, resistivity, etc., at various depths. Such well logging may be performed using, for example, the drilling tool of FIG. 1B and/or the wireline tool of FIG. 1C. Once the well is formed and completed, fluid flows to the surface using production tubing as shown in FIG. 1D. As fluid passes to the surface, various dynamic measurements, such as fluid flow rates, pressure, and composition may be monitored. These parameters may be used to determine various characteristics of the subterranean formation.

Sensors may be positioned about the oilfield to collect data relating to various oilfield operations. For example, sensors in the drilling equipment may monitor drilling conditions, sensors in the wellbore may monitor fluid composition, sensors located along the flow path may monitor flow rates, and sensors at the processing facility may monitor fluids collected. Other sensors may be provided to monitor downhole, surface, equipment or other conditions. The monitored data is often used to make decisions at various locations of the oilfield at various times. Data collected by these sensors may be further analyzed and processed. Data may be collected and used for current or future operations. When used for future operations at the same or other locations, such data may sometimes be referred to as historical data.

The processed data may be used to predict downhole conditions, and make decisions concerning oilfield operations. Such decisions may involve well planning, well targeting, well completions, operating levels, production rates and other operations and/or conditions. Often this information is used to determine when to drill new wells, re-complete existing wells, or alter wellbore production.

Data from one or more wellbores may be analyzed to plan or predict various outcomes at a given wellbore. In some cases, the data from neighboring wellbores or wellbores with similar conditions or equipment may be used to predict how a well will perform. There are usually a large number of variables and large quantities of data to consider in analyzing oilfield operations. It is, therefore, often useful to model the behavior of the oilfield operation to determine the desired course of action. During the ongoing operations, the operating conditions may need adjustment as conditions change and new information is received.

Techniques have been developed to model the behavior of various aspects of the oilfield operations, such as geological structures, downhole reservoirs, wellbores, surface facilities as well as other portions of the oilfield operation. For example, U.S. Pat. No. 6,980,940 to Gurpinar discloses integrated reservoir optimization involving the assimilation of diverse data to optimize overall performance of a reservoir. In another example, WO2004/049216 to Ghorayeb discloses an integrated modeling solution for coupling multiple reservoir simulations and surface facility networks. Other examples of these modeling techniques are shown in Patent/Publication/Application Nos. U.S. Pat. No. 5,992,519, WO1999/064896, WO2005/122001, U.S. Pat. No. 6,313,837, US2003/0216897, US2003/0132934, US2005/0149307, US2006/0197759, US2004/0220846, and Ser. No. 10/586,283.

Techniques have also been developed to predict and/or plan certain oilfield operations, such as miscible water alternating gas (MWAG) injection operation. In an oilfield, initial production of the hydrocarbons is accomplished by "primary recovery" techniques wherein only the natural forces present in the reservoir are used to produce the hydrocarbons. However, upon depletion of these natural forces and the termination of primary recovery, large portions of the hydrocarbons remain trapped within the reservoir. Also many reservoirs lack sufficient natural forces to be produced by primary methods from the very beginning.

Recognition of these facts has led to the development and use of many enhanced oil recovery (EOR) techniques. Most of these techniques involve injection of at least one fluid into the reservoir to force hydrocarbons towards and into a production well. It is important that the fluid be injected carefully so that it forces the hydrocarbons toward the production well but does not prematurely reach the production well before all or most of the hydrocarbons have been produced.

Generally, once the fluid reaches the production well, production is adversely affected as the injected fluids are not generally sellable products and in some cases can be difficult to separate from the produced oil. Over the years, many have attempted to calculate the optimal pumping rates for injector wells and production wells to extract the most hydrocarbons from a reservoir. There is considerable uncertainty in a reservoir as to its geometry and geological parameters (e.g., porosity, rock permeabilities, etc.). In addition, the market value of hydrocarbons can vary dramatically and so financial factors may be important in determining how production should proceed to obtain the maximum value from the reservoir. Examples of techniques for modeling and/or planning MWAG injection operation are provided in U.S. Pat. No. 6,775,578.

Techniques have also been developed for performing reservoir simulation operations. See, for example, Patent/Publication/Application Nos. U.S. Pat. No. 6,230,101, U.S. Pat. No. 6,018,497, U.S. Pat. No. 6,078,869, GB2336008, U.S. Pat. No. 6,106,561, US2006/0184329, U.S. Pat. No. 7,164,990. Some simulation techniques involve the use of coupled simulations as described, for example, in Publication No. US2006/0129366.

Despite the development and advancement of reservoir simulation techniques in oilfield operations, there remains a need to provide techniques capable of modeling and implementing injection operations based on a complex analysis of a wide variety of parameters affecting oilfield operations. It is desirable that such a complex analysis of oilfield parameters gathered throughout the oilfield and their impact on the injection operation be performed as thru-time analysis. It is further desirable that such techniques for modeling oilfield MWAG injection operations be capable of one of more of the following, among others: selectively modeling oilfield MWAG injection operations based on more than one simulator; selectively merging data and/or outputs of more than one simulator; selectively merging data and/or outputs of simulators of one or more wellsites and/or oilfields; selectively linking a wide variety of simulators of like and/or different configurations; selectively linking simulators having similar and/or different applications and/or data models; selectively linking simulators of different members of an asset team of an oilfield; and providing coupling mechanisms capable of selectively linking simulators in a desired configuration.

SUMMARY OF THE INVENTION

In general, in one aspect, the invention relates to a method of simulating operations of an oilfield, which has process facilities and wellsite operatively connected, each wellsite having a wellbore penetrating a subterranean formation for extracting fluid from an underground reservoir. The method steps include selecting simulators for modeling the oilfield with at least one of the simulators having functionality to model fluid injection, selectively coupling each of the simulators according to a predefined configuration, and modeling an injection operation of the oilfield by selectively communicating between the simulators.

In general, in one aspect, the invention relates to a method of simulating operations of an oilfield, which has process facilities and wellsite operatively connected, each wellsite having a wellbore penetrating a subterranean formation for extracting fluid from an underground reservoir. The method steps include selecting simulators for modeling the oilfield with at least one of the simulators having functionality to perform thru-time dynamic modeling of an injection operation, selectively coupling each of the simulators according to a predefined configuration, and performing the thru-time dynamic modeling of the oilfield by selectively communicating between the simulators.

In general, in one aspect, the invention relates to a computer readable medium embodying instructions executable by a computer to perform method steps for simulating operations of an oilfield, which has process facilities and wellsite operatively connected, each wellsite having a wellbore penetrating a subterranean formation for extracting fluid from an underground reservoir. The method steps include selecting simulators for modeling the oilfield with at least one of the simulators having functionality to model fluid injection, selectively coupling each of the simulators according to a predefined configuration, and modeling an injection operation of the oilfield by selectively communicating between the simulators.

In general, in one aspect, the invention relates to a computer readable medium embodying instructions executable by a computer to perform method steps for simulating operations of an oilfield, which has process facilities and wellsite operatively connected, each wellsite having a wellbore penetrating a subterranean formation for extracting fluid from an underground reservoir. The method steps include selecting simulators for modeling the oilfield with at least one of the simulators having functionality to perform thru-time dynamic modeling of an injection operation, selectively coupling each of the simulators according to a predefined configuration, and performing the thru-time dynamic modeling of the oilfield by selectively communicating between the simulators.

Other aspects and advantages of the invention will be apparent from the following description and the appended claims.

BRIEF DESCRIPTION OF THE DRAWINGS

So that the above recited features and advantages of the present invention can be understood in detail, a more particular description of the invention, briefly summarized above, may be had by reference to the embodiments thereof that are illustrated in the appended drawings. It is to be noted, however, that the appended drawings illustrate only typical embodiments of this invention and are therefore not to be considered limiting of its scope, for the invention may admit to other equally effective embodiments.

FIG. 1A depicts an exemplary survey operation being performed by a seismic truck. FIG. 1B depicts an exemplary drilling operation being performed by a drilling tool suspended by a rig and advanced into the subterranean formation. FIG. 1C depicts an exemplary wireline operation being performed by a wireline tool suspended by the rig and into the wellbore of FIG. 1B. FIG. 1D depicts an exemplary simulation operation being performed by a simulation tool being deployed from the rig and into a completed wellbore for drawing fluid from the downhole reservoir into a surface facility.

FIG. 2A depicts an exemplary seismic trace of the subterranean formation of FIG. 1A. FIG. 2B depicts exemplary core sample of the formation shown in FIG. 1B. FIG. 2C depicts an exemplary well log of the subterranean formation of FIG. 1C. FIG. 2D depicts an exemplary simulation decline curve of fluid flowing through the subterranean formation of FIG. 1D.

FIG. 7A depicts an unconstrained rate-based coupling. FIG. 7B depicts a reservoir constrained rate-based coupling.

FIG. 9A depicts a network constrained well. FIG. 9B depicts a reservoir constrained well. FIG. 9C depicts a reservoir with reduced pressure.

DETAILED DESCRIPTION OF THE INVENTION

Figure 1A:
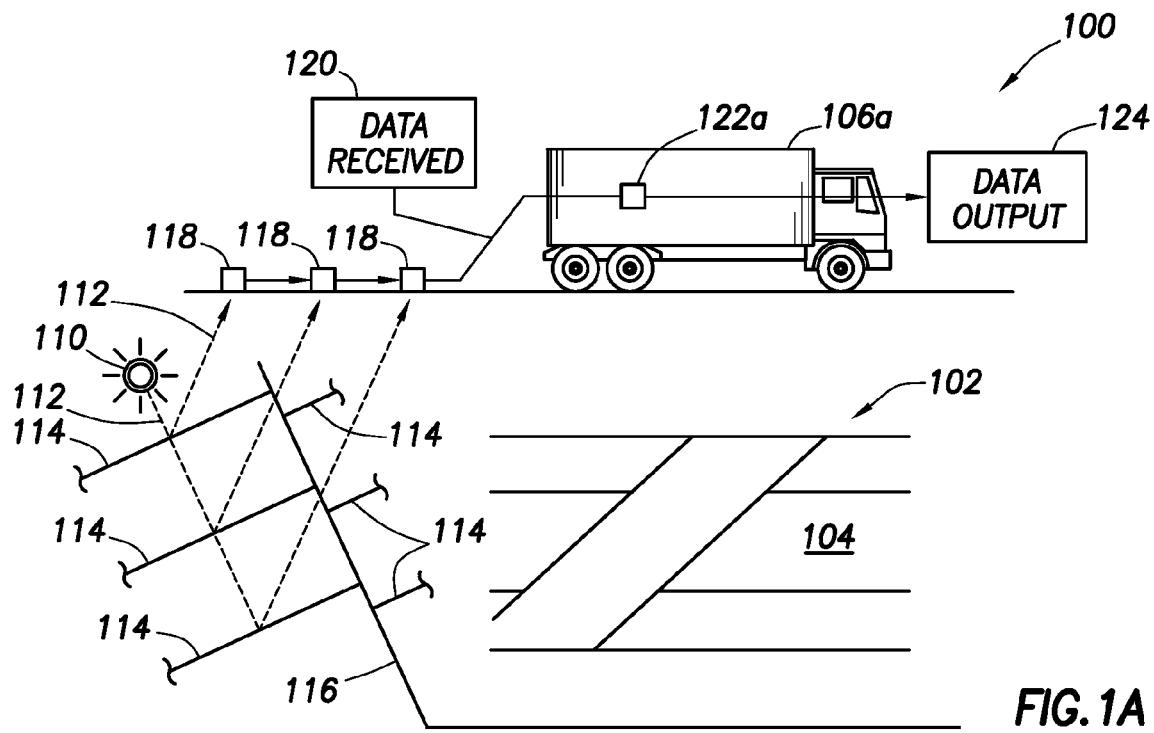
FIGS. 1A-1D show exemplary schematic views of an oilfield having subterranean structures including reservoirs therein and various oilfield operations being performed on the oilfield.

Presently preferred embodiments of the invention are shown in the above-identified figures and described in detail below. In describing the preferred embodiments, like or identical reference numerals are used to identify common or similar elements. The figures are not necessarily to scale and certain features and certain views of the figures may be shown exaggerated in scale or in schematic in the interest of clarity and conciseness.

FIGS. 1A-D show an oilfield (100) having geological structures and/or subterranean formations therein. As shown in these figures, various measurements of the subterranean formation are taken by different tools at the same location. These measurements may be used to generate information about the formation and/or the geological structures and/or fluids contained therein.

FIGS. 1A-1D depict schematic views of an oilfield (100) having subterranean formations (102) containing a reservoir (104) therein and depicting various oilfield operations being performed on the oilfield (100). FIG. 1A depicts a survey operation being performed by a seismic truck (106a) to measure properties of the subterranean formation. The survey operation is a seismic survey operation for producing sound vibration(s) (112). In FIG. 1A, one such sound vibration (112) is generated by a source (110) and reflects off a plurality of horizons (114) in an earth formation (116). The sound vibration(s) (112) is (are) received in by sensors (S), such as geophone-receivers (118), situated on the earth's surface, and the geophone-receivers (118) produce electrical output signals, referred to as data received (120) in FIG. 1.

In response to the received sound vibration(s) (112) representative of different parameters (such as amplitude and/or frequency) of the sound vibration(s) (112). The data received (120) is provided as input data to a computer (122a) of the seismic recording truck (106a), and responsive to the input data, the recording truck computer (122a) generates a seismic data output record (124). The seismic data may be further processed as desired, for example by data reduction.

Figure 1B:
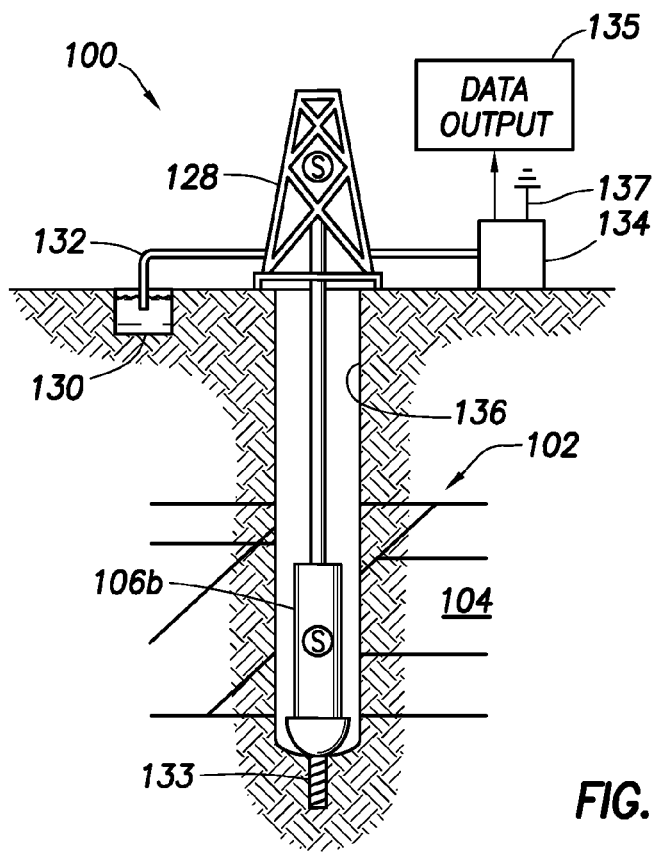

FIG. 1B depicts a drilling operation being performed by a drilling tool (106b) suspended by a rig (128) and advanced into the subterranean formation (102) to form a wellbore (136). A mud pit (130) is used to draw drilling mud into the drilling tool (106b) via flow line (132) for circulating drilling mud through the drilling tool (106b) and back to the surface. The drilling tool (106b) is advanced into the formation to reach reservoir (104). The drilling tool (106b) is preferably adapted for measuring downhole properties. The drilling tool (106b) may also be adapted for taking a core sample (133) as shown, or removed so that a core sample (133) may be taken using another tool.

A surface unit (134) is used to communicate with the drilling tool (106b) and offsite operations. The surface unit (134) is capable of communicating with the drilling tool (106b) to send commands to drive the drilling tool (106b), and to receive data therefrom. The surface unit (134) is preferably provided with computer facilities for receiving, storing, processing, and analyzing data from the oilfield (100). The surface unit (134) collects data output (135) generated during the drilling operation. Computer facilities, such as those of the surface unit (134), may be positioned at various locations about the oilfield (100) and/or at remote locations.

Sensors (S), such as gauges, may be positioned throughout the reservoir, rig, oilfield equipment (such as the downhole tool), or other portions of the oilfield for gathering information about various parameters, such as surface parameters, downhole parameters, and/or operating conditions. These sensors (S) preferably measure oilfield parameters, such as weight on bit, torque on bit, pressures, temperatures, flow rates, compositions and other parameters of the oilfield operation.

The information gathered by the sensors (S) may be collected by the surface unit (134) and/or other data collection sources for analysis or other processing. The data collected by the sensors (S) may be used alone or in combination with other data. The data may be collected in a database and all or select portions of the data may be selectively used for analyzing and/or predicting oilfield operations of the current and/or other wellbores.

Data outputs from the various sensors (S) positioned about the oilfield may be processed for use. The data may be historical data, real time data, or combinations thereof. The real time data may be used in real time, or stored for later use. The data may also be combined with historical data or other inputs for further analysis. The data may be housed in separate databases, or combined into a single database.

The collected data may be used to perform analysis, such as modeling operations. For example, the seismic data output may be used to perform geological, geophysical, reservoir engineering, and/or production simulations. The reservoir, wellbore, surface and/or process data may be used to perform reservoir, wellbore, or other production simulations. The data outputs from the oilfield operation may be generated directly from the sensors (S), or after some preprocessing or modeling. These data outputs may act as inputs for further analysis.

The data is collected and stored at the surface unit (134). One or more surface units (134) may be located at the oilfield (100), or linked remotely thereto. The surface unit (134) may be a single unit, or a complex network of units used to perform the necessary data management functions throughout the oilfield (100). The surface unit (134) may be a manual or automatic system. The surface unit (134) may be operated and/or adjusted by a user.

The surface unit (134) may be provided with a transceiver (137) to allow communications between the surface unit (134) and various portions (or regions) of the oilfield (100) or other locations. The surface unit (134) may also be provided with or functionally linked to a controller for actuating mechanisms at the oilfield (100). The surface unit (134) may then send command signals to the oilfield (100) in response to data received. The surface unit (134) may receive commands via the transceiver or may itself execute commands to the controller. A processor may be provided to analyze the data (locally or remotely) and make the decisions to actuate the controller. In this manner, the oilfield (100) may be selectively adjusted based on the data collected to optimize fluid recovery rates, or to maximize the longevity of the reservoir and its ultimate production capacity. These adjustments may be made automatically based on computer protocol, or manually by an operator. In some cases, well plans may be adjusted to select optimum operating conditions, or to avoid problems.

Figure 1C:
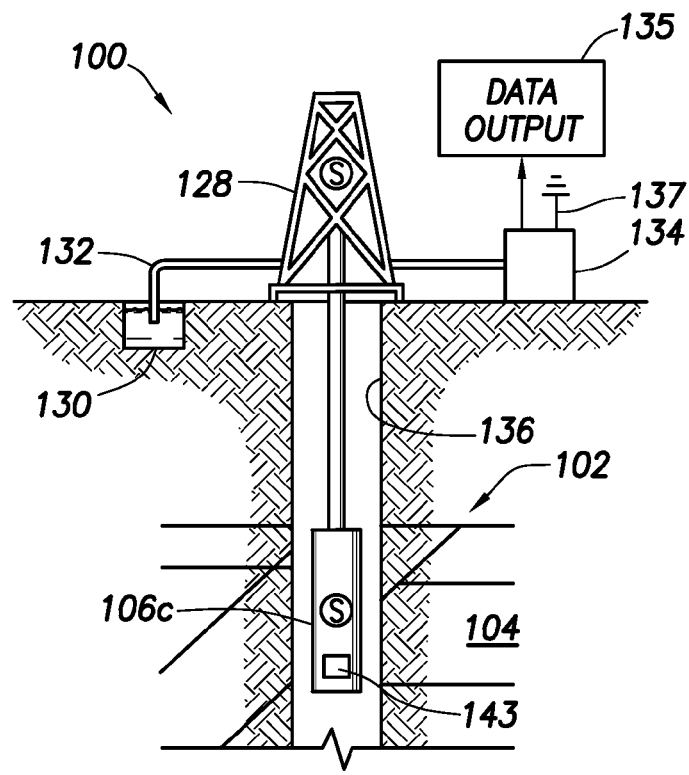

FIG. 1C depicts a wireline operation being performed by a wireline tool (106c) suspended by the rig (128) and into the wellbore (136) of FIG. 1B. The wireline tool (106c) is preferably adapted for deployment into a wellbore (136) for performing well logs, performing downhole tests and/or collecting samples. The wireline tool (106c) may be used to provide another method and apparatus for performing a seismic survey operation. The wireline tool (106c) of FIG. 1C may have an explosive or acoustic energy source (143) that provides electrical signals to the surrounding subterranean formations (102).

The wireline tool (106c) may be operatively linked to, for example, the geophones (118) stored in the computer (122a) of the seismic recording truck (106a) of FIG. 1A. The wireline tool (106c) may also provide data to the surface unit (134). As shown data output (135) is generated by the wireline tool (106c) and collected at the surface. The wireline tool (106c) may be positioned at various depths in the wellbore (136) to provide a survey of the subterranean formation.

Figure 1D:
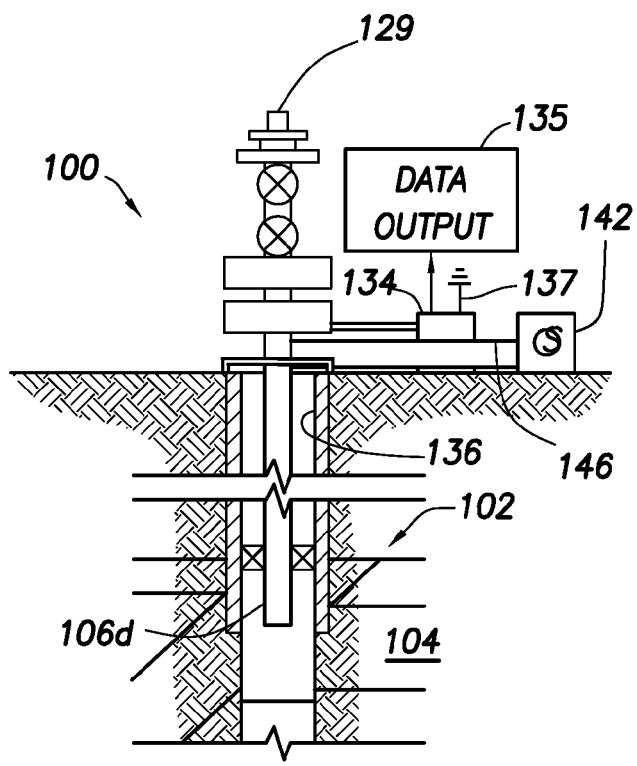

FIG. 1D depicts a production operation being performed by a production tool (106d) deployed from a production unit or Christmas tree (129) and into the completed wellbore (136) of FIG. 1C for drawing fluid from the downhole reservoirs into the surface facilities (142). Fluid flows from reservoir (104) through perforations in the casing (not shown) and into the production tool (106d) in the wellbore (136) and to the surface facilities (142) via a gathering network (146).

Sensors (S), such as gauges, may be positioned about the oilfield to collect data relating to various oilfield operations as described previously. As shown, the sensor (S) may be positioned in the production tool (106d) or associated equipment, such as the Christmas tree, gathering network, surface facilities and/or the production facility, to measure fluid parameters, such as fluid composition, flow rates, pressures, temperatures, and/or other parameters of the production operation.

While only simplified wellsite configurations are shown, it will be appreciated that the oilfield may cover a portion of land, sea and/or water locations that hosts one or more wellsites. Production may also include injection wells (not shown) for added recovery. One or more gathering facilities may be operatively connected to one or more of the wellsites for selectively collecting downhole fluids from the wellsite(s).

While FIGS. 1B-1D depict tools used to measure properties of an oilfield (100), it will be appreciated that the tools may be used in connection with non-oilfield operations, such as mines, aquifers, storage or other subterranean facilities. Also, while certain data acquisition tools are depicted, it will be appreciated that various measurement tools capable of sensing parameters, such as seismic two-way travel time, density, resistivity, production rate, etc., of the subterranean formation and/or its geological formations may be used. Various sensors (S) may be located at various positions along the wellbore and/or the monitoring tools to collect and/or monitor the desired data. Other sources of data may also be provided from offsite locations.

The oilfield configuration in FIGS. 1A-1D are intended to provide a brief description of an example of an oilfield usable with the present invention. Part, or all, of the oilfield (100) may be on land and/or sea. Also, while a single oilfield measured at a single location is depicted, the present invention may be utilized with any combination of one or more oilfields (100), one or more processing facilities and one or more wellsites.

Figure 2A:
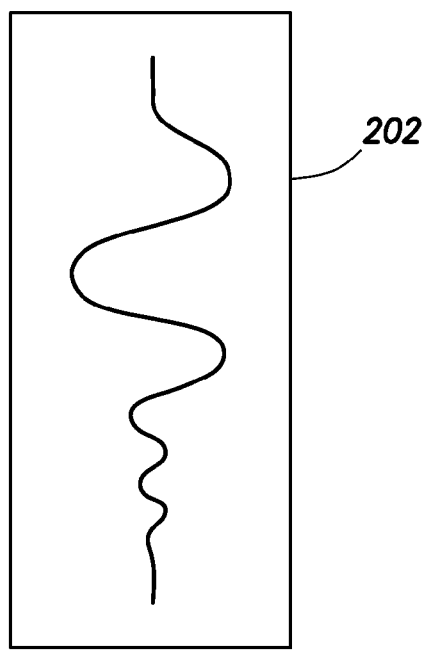
FIGS. 2A-2D are exemplary graphical depictions of data collected by the tools of FIGS. 1A-1D, respectively.
Figure 2B:
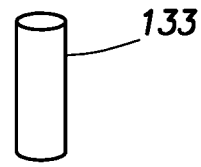
Figure 2C:
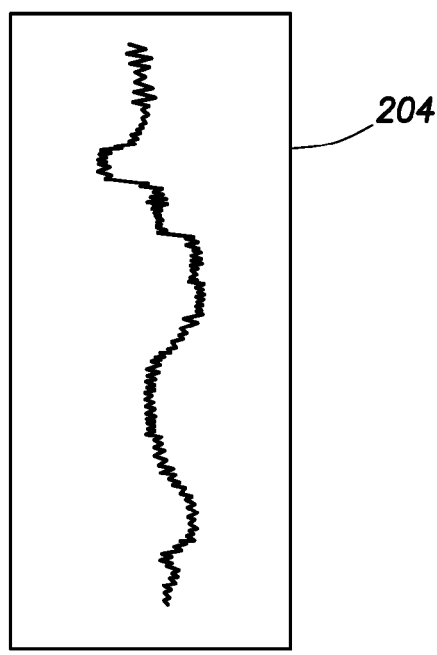
Figure 2D:
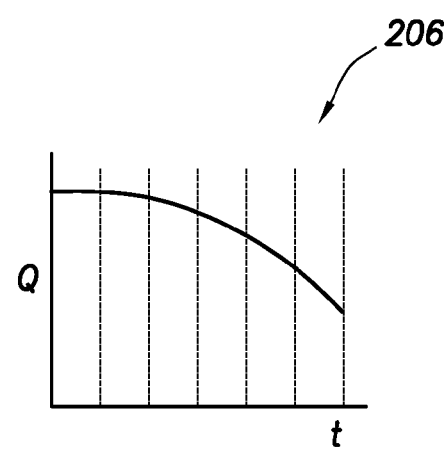

FIGS. 2A-2D are graphical depictions of data collected by the tools of FIGS. 1A-D, respectively. FIG. 2A depicts a seismic trace (202) of the subterranean formation of FIG. 1A taken by survey tool (106a). The seismic trace measures a two-way response over a period of time. FIG. 2B depicts a core sample (133) taken by the drilling tool (106b). The core test typically provides a graph of the density, resistivity, or other physical property of the core sample (133) over the length of the core. Tests for density and viscosity are often performed on the fluids in the core at varying pressures and temperatures. FIG. 2C depicts a well log (204) of the subterranean formation of FIG. 1C taken by the wireline tool (106c). The wireline log typically provides a resistivity measurement of the formation at various depths. FIG. 2D depicts a production decline curve (206) of fluid flowing through the subterranean formation of FIG. 1D taken by the production tool (106d). The production decline curve (206) typically provides the production rate Q as a function of time t.

The respective graphs of FIGS. 2A-2C contain static measurements that describe the physical characteristics of the formation. These measurements may be compared to determine the accuracy of the measurements and/or for checking for errors. In this manner, the plots of each of the respective measurements may be aligned and scaled for comparison and verification of the properties.

FIG. 2D provides a dynamic measurement of the fluid properties through the wellbore. As the fluid flows through the wellbore, measurements are taken of fluid properties, such as flow rates, pressures, composition, etc. As described below, the static and dynamic measurements may be used to generate models of the subterranean formation to determine characteristics thereof.

Figure 3:
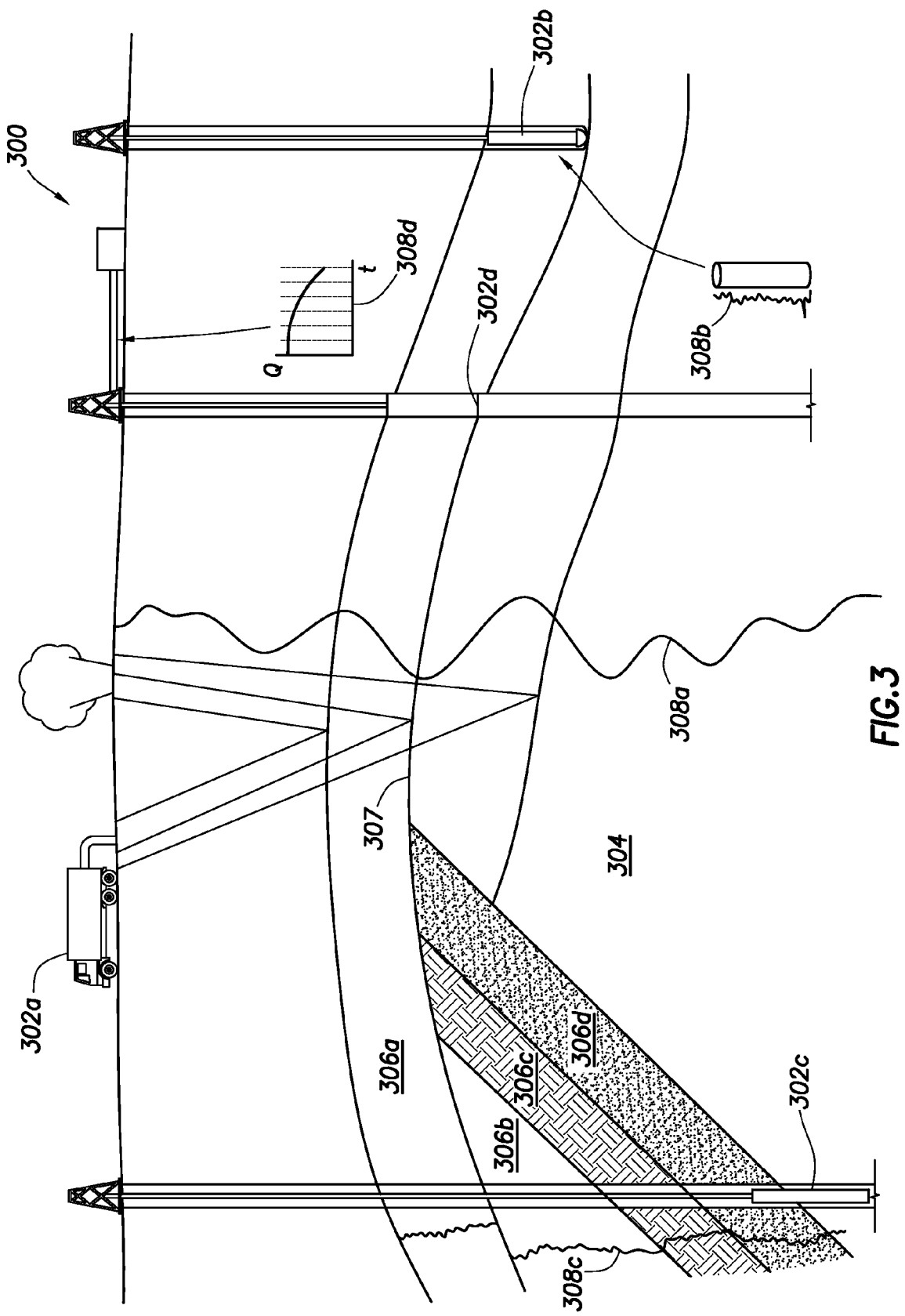
FIG. 3 shows an exemplary schematic view, partially in cross section, of an oilfield having a plurality of data acquisition tools positioned at various locations along the oilfield for collecting data from the subterranean formation.

FIG. 3 is a schematic view, partially in cross section of an oilfield (300) having data acquisition tools (302a), (302b), (302c), and (302d) positioned at various locations along the oilfield for collecting data of a subterranean formation (304). The data acquisition tools (302a-302d) may be the same as data acquisition tools (106a-106d) of FIG. 1, respectively. As shown, the data acquisition tools (302a-302d) generate data plots or measurements (308a-308d), respectively.

Data plots (308a-308c) are examples of static data plots that may be generated by the data acquisition tools (302a-302d), respectively. Static data plot (308a) is a seismic two-way response time and may be the same as the seismic trace (202) of FIG. 2A. Static plot (308b) is core sample data measured from a core sample of the formation (304), similar to the core sample (133) of FIG. 2B. Static data plot (308c) is a logging trace, similar to the well log (204) of FIG. 2C. Data plot (308d) is a dynamic data plot of the fluid flow rate over time, similar to the graph (206) of FIG. 2D. Other data may also be collected, such as historical data, user inputs, economic information, other measurement data, and other parameters of interest.

The subterranean formation (304) has a plurality of geological structures (306a-306d). As shown, the formation has a sandstone layer (306a), a limestone layer (306b), a shale layer (306c), and a sand layer (306d). A fault line (307) extends through the formation. The static data acquisition tools are preferably adapted to measure the formation and detect the characteristics of the geological structures of the formation.

While a specific subterranean formation (304) with specific geological structures are depicted, it will be appreciated that the formation may contain a variety of geological structures. Fluid may also be present in various portions of the formation. Each of the measurement devices may be used to measure properties of the formation and/or its underlying structures. While each acquisition tool is shown as being in specific locations along the formation, it will be appreciated that one or more types of measurement may be taken at one or more location across one or more oilfields or other locations for comparison and/or analysis.

The data collected from various sources, such as the data acquisition tools of FIG. 3, may then be evaluated. Typically, seismic data displayed in the static data plot (308a) from the data acquisition tool (302a) is used by a geophysicist to determine characteristics of the subterranean formation (304). Core data shown in static plot (308b) and/or log data from the well log (308c) is typically used by a geologist to determine various characteristics of the geological structures of the subterranean formation (304). Production data from the production graph (308d) is typically used by the reservoir engineer to determine fluid flow reservoir characteristics.

Figure 4:
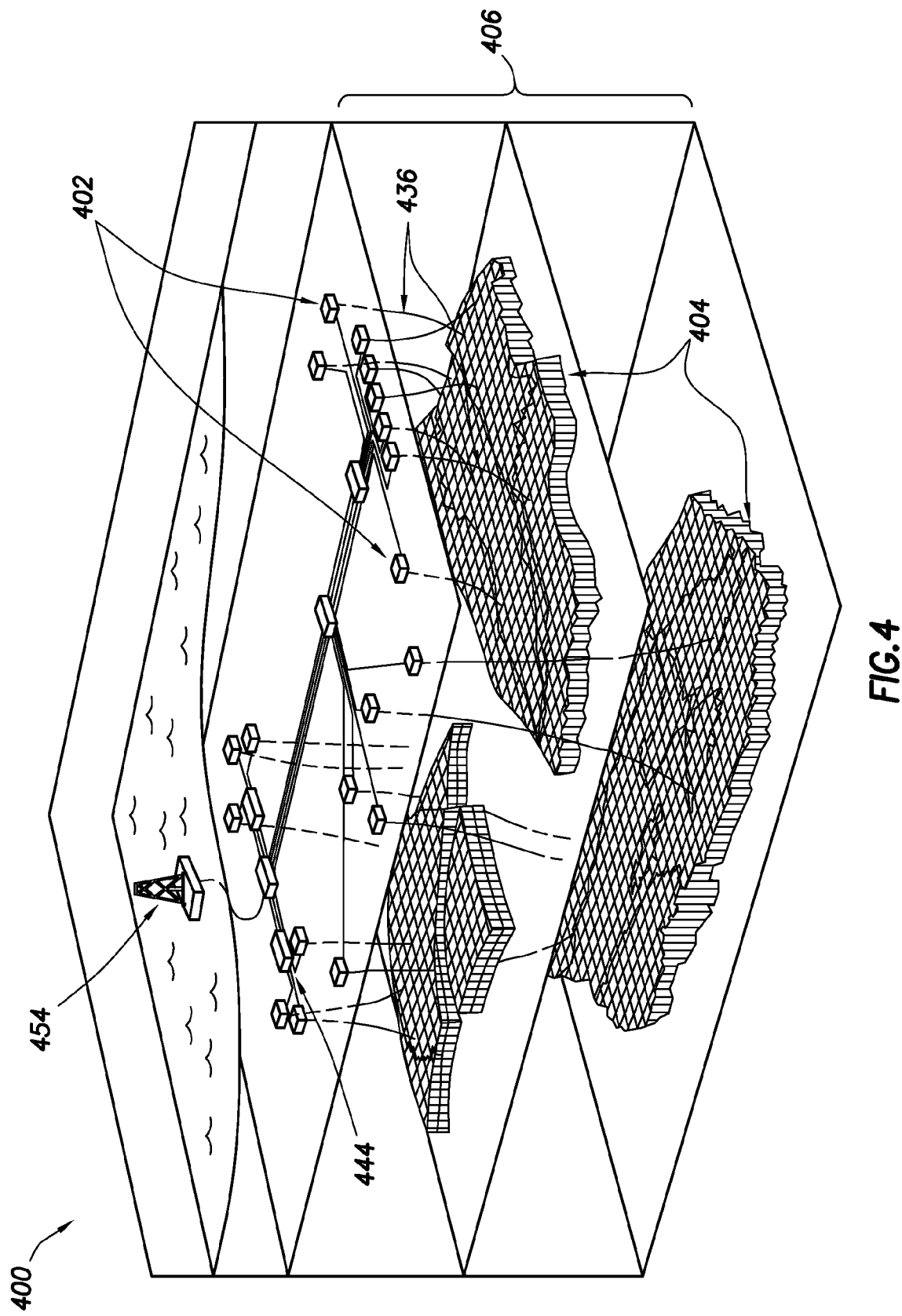
FIG. 4 shows an exemplary schematic view of an oilfield having a plurality of wellsites for producing hydrocarbons from the subterranean formation.

FIG. 4 shows an oilfield (400) for performing simulation operations. As shown, the oilfield has a plurality of wellsites (402) operatively connected to a central processing facility (454). The oilfield configuration of FIG. 4 is not intended to limit the scope of the invention. Part or all of the oilfield may be on land and/or sea. Also, while a single oilfield with a single processing facility and a plurality of wellsites is depicted, any combination of one or more oilfields, one or more processing facilities and one or more wellsites may be present.

Each wellsite (402) has equipment that forms a wellbore (436) into the earth. The wellbores extend through subterranean formations (406) including reservoirs (404). These reservoirs (404) contain fluids, such as hydrocarbons. The wellsites draw fluid from the reservoirs and pass them to the processing facilities via surface networks (444). The surface networks (444) have tubing and control mechanisms for controlling the flow of fluids from the wellsite to the processing facility (454).

Figure 5:
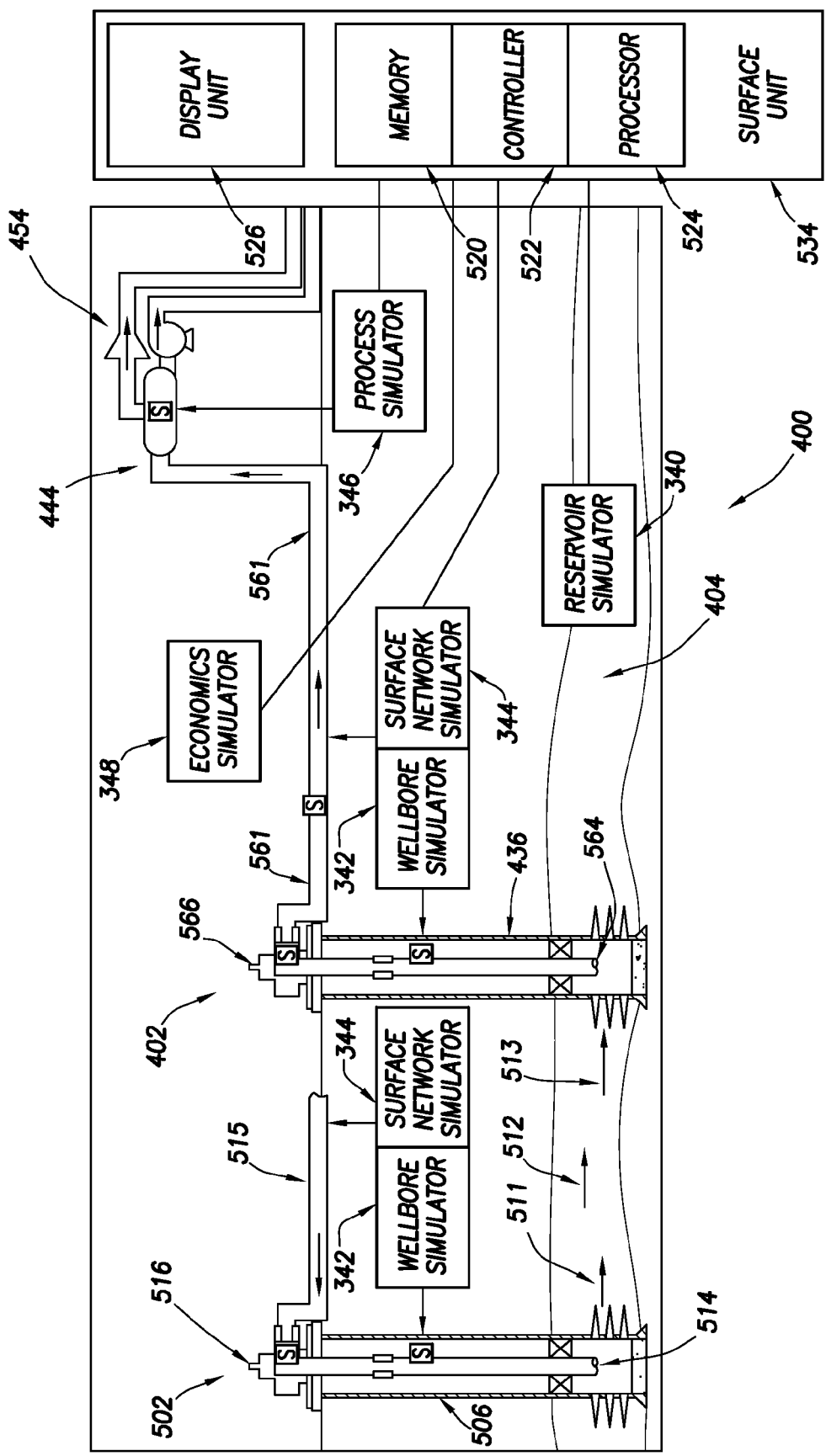
FIG. 5 shows an exemplary schematic diagram of a portion of the oilfield of FIG. 4 depicting the simulation operation in detail.

FIG. 5 shows a schematic view of a portion (or region) of the oilfield (400) of FIG. 4, depicting a producing wellsite (402) and surface network (444) in detail. The wellsite (402) of FIG. 5 has a wellbore (436) extending into the earth therebelow. In addition, FIG. 5 shows an injection wellsite (502) having an injection wellbore (506). As shown, the wellbores (436) and (506) has already been drilled, completed, and prepared for production from reservoir (404).

Wellbore production equipment (564) extends from a wellhead (566) of wellsite (402) and to the reservoir (404) to draw fluid to the surface. The wellsite (402) is operatively connected to the surface network (444) via a transport line (561). Fluid flows from the reservoir (404), through the wellbore (436), and onto the surface network (444). The fluid then flows from the surface network (444) to the process facilities (454).

As described above, fluid may be injected through an injection wellbore, such as the wellbore (506) to gain additional amounts of hydrocarbon. Fluid may be injected to sweep hydrocarbons to producing wells and/or to maintain reservoir pressure by balancing extracted hydrocarbons with injected fluid. The wellbore (506) may be a new well drilled specifically to serve as an injection wellbore, or an already existing well that is no longer producing hydrocarbons economically. As shown in FIG. 5, wellbore injection equipment (514) extends from a wellhead (516) of injection wellsite (502) to inject fluid (e.g., shown as (511) and (512) in FIG. 5) in or around the periphery of the reservoir (404) to push hydrocarbons (e.g., shown as (513) in FIG. 5) toward a producing wellbore, such as the wellbore (436). The injection wellsite (502) is operatively connected to an injection transport line (515), which provides the injection fluid to the injection wellsite (502) through the wellhead (516) and down through the well injection equipment (514).

The injected fluid may include water, steam, gas (e.g., carbon dioxide), polymer, surfactant, other suitable liquid, or any combinations thereof. A substance that is capable of mixing with hydrocarbons remaining in the well is called miscible. For example, a surfactant (e.g., shown as (511) in FIG. 5), a chemical similar to washing detergents, can be injected into a reservoir mixing with some of the hydrocarbons locked in rock pores (e.g., shown as (512) in FIG. 5), and releases the hydrocarbons so that fluid (e.g., shown as (513) in FIG. 5) can be pushed towards the producing wells. One technique in fluid injection is MWAG injection, which involves the use of gases such as natural gas (i.e., naturally occurring mixture of hydrocarbon gases), carbon dioxide, or other suitable gases. The injected gas (e.g., natural gas, carbon dioxide, etc.) mixes with some of the remaining hydrocarbons in the reservoir, unlocks it from the pores, and pushes the fluid (e.g., shown as (513) in FIG. 5) to producing wells. Water (e.g., shown as (511) in FIG. 5) is often injected behind the gas (e.g., shown as (512) in FIG. 5) to push the miscible gas and unlocked hydrocarbons along based on the incompressible nature of water. Another technique involves injecting steam for heavy oil production such as Thermal Heavy Oil Production with steam injection and Cold Heavy Oil Production with Sand (CHOPS). CHOPS typically refers to a non-thermal primary process for producing heavy oil. In this method, continuous production of sand improves the recovery of heavy oil from the reservoir. In many cases, an artificial lift system is used to lift the oil with sand. Said in another word, CHOPS often involves the deliberate initiation of sand influx into a perforated oil well to produce oil along with the sand. Steam injection facilitates pressure drops in the formation to enhance the movement of heavy cold mixture of sand with oil.

The efficacy of the MWAG injection in recovering remaining hydrocarbons from an oilfield depends on careful planning of the injection schedules such as the selection of fluid, the determination of the composition of the fluid to ensure the miscibility, the pumping rate, the switching cycles between different injected fluid, the controlled interface, and capillary forces between different injected fluid, etc. The MWAG injection schedule should be determined considering geological and geo-physical information, such as temperature, pressure, porosity, permeability, composition, etc. In addition to the complexity in determining MWAG injection schedules, the source of the injection fluid, the constraints of the processing facilities and surface network, and market value of oil can all impact the overall performance of the oilfield operation. Similarly, the efficacy in using steam injection to enhance thermal heavy oil production and/or CHOPS also depends on careful planning of the injection schedules as described above.

An integrated simulation method described below, can be used, for example, to model the MWAG injection operation and the heavy oil production with steam injection (e.g., CHOPS) operation including various aspects of the oilfield, such as geological, geo-physical, operational, financial, etc. In the integrated simulation method, various constraints of the oilfield operation may be considered, such as the network constraints, the processing facility constraints, the fluid source constraints, the reservoir constraints, the market price constraints, the financial constraints, etc.

As further shown in FIG. 5, sensors (S) are located about the oilfield (400) to monitor various parameters during oilfield operations. The sensors (S) may measure, for example, pressure, temperature, flow rate, composition, and other parameters of the reservoir, wellbore, surface network, process facilities and/or other portions (or regions) of the oilfield operation. These sensors (S) are operatively connected to a surface unit (534) for collecting data therefrom. The surface unit may be, for example, similar to the surface unit (134) of FIGS. 1A-D.

One or more surface units (534) may be located at the oilfield (400), or linked remotely thereto. The surface unit (534) may be a single unit, or a complex network of units used to perform the necessary modeling/planning/management functions (e.g., in MWAG injection scheduling or steam injection scheduling for heavy oil production such as CHOPS) throughout the oilfield (400). The surface unit may be a manual or automatic system. The surface unit may be operated and/or adjusted by a user. The surface unit is adapted to receive and store data. The surface unit may also be equipped to communicate with various oilfield equipment. The surface unit may then send command signals to the oilfield in response to data received or modeling performed. For example, the MWAG injection schedule or the steam injection schedule may be adjusted and/or optimized based on modeling results updated according to changing parameters throughout the oilfield, such as geological parameters, geo-physical parameters, network parameters, process facility parameters, injection fluid parameters, market parameters, financial parameters, etc.

As shown in FIG. 5, the surface unit (534) has computer facilities, such as memory (520), controller (522), processor (524), and display unit (526), for managing the data. The data is collected in memory (520), and processed by the processor (524) for analysis. Data may be collected from the oilfield sensors (S) and/or by other sources. For example, oilfield data may be supplemented by historical data collected from other operations, or user inputs.

The analyzed data (e.g., based on modeling performed) may then be used to make decisions. A transceiver (not shown) may be provided to allow communications between the surface unit (534) and the oilfield (400). The controller (522) may be used to actuate mechanisms at the oilfield (400) via the transceiver and based on these decisions. In this manner, the oilfield (400) may be selectively adjusted based on the data collected. These adjustments may be made automatically based on computer protocol and/or manually by an operator. In some cases, well plans are adjusted to select optimum operating conditions or to avoid problems.

To facilitate the processing and analysis of data, simulators may be used to process the data for modeling various aspects of the oilfield operation. Specific simulators are often used in connection with specific oilfield operations, such as reservoir or wellbore simulation. Data fed into the simulator(s) may be historical data, real time data or combinations thereof. Simulation through one or more of the simulators may be repeated or adjusted based on the data received.

As shown, the oilfield operation is provided with wellsite and non-wellsite simulators. The wellsite simulators may include a reservoir simulator (340), a wellbore simulator (342), and a surface network simulator (344). The reservoir simulator (340) solves for hydrocarbon flow through the reservoir rock and into the wellbores. The wellbore simulator (342) and surface network simulator (344) solves for hydrocarbon flow through the wellbore and the surface network (444) of pipelines. As shown, some of the simulators may be separate or combined, depending on the available systems.

The non-wellsite simulators may include process (346) and economics (348) simulators. The processing unit has a process simulator (346). The process simulator (346) models the processing plant (e.g., the process facilities (454)) where the hydrocarbon(s) is/are separated into its constituent components (e.g., methane, ethane, propane, etc.) and prepared for sales. The oilfield (400) is provided with an economics simulator (348). The economics simulator (348) models the costs of part or the entire oilfield (400) throughout a portion or the entire duration of the oilfield operation. Various combinations of these and other oilfield simulators may be provided.

Figure 6:
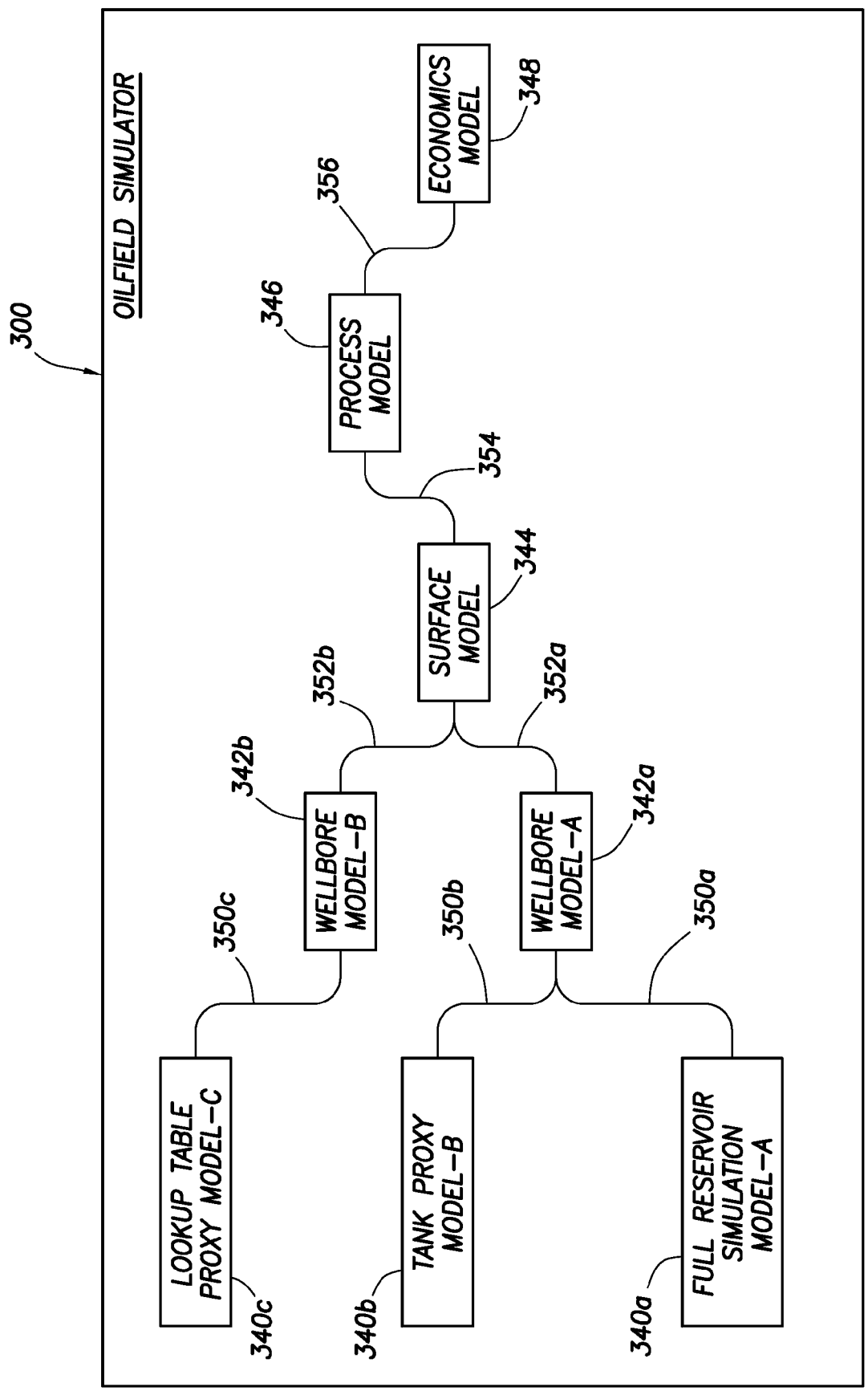
FIG. 6 is a schematic view of an oilfield simulator for the oilfield of FIG. 4, the oilfield simulator having wellsite and non-wellsite simulators selectively coupled together to perform an oilfield simulation.

FIG. 6 depicts a schematic view of an oilfield simulator (300) for modeling operations of an oilfield (300). This simulator (300) may form part of an overall production system of the oilfield. As shown, several simulators of the oilfield are operatively linked as an integrated asset model for modeling integrated operation therebetween. Depending on the desired outcome, certain simulators may be selectively linked in a desired configuration. While a variety of combinations may be envisioned, FIG. 6 depicts the combination of three reservoir simulators (340a, 340b, 340c), two wellbore simulators (342a, 342b), a surface network simulator (344), a process simulator (346) and an economics simulator (348). A variety of combinations of two or more simulators may be selectively linked to perform integrated simulations.

In the example shown, a set of simulators is selected to depict the various sources that affect the flow of fluid through the oilfield. At the far left are three different reservoir simulators (340a, 340b, 340c), which are provided to depict various levels of approximation in mathematical representation of the reservoir. These reservoir simulators (340a, 340b, 340c) calculate the flow of hydrocarbon(s) from the reservoir and into the wells and the flow of fluid into the reservoir from injection wells. One or more of the same and/or different reservoir simulators may be used. For example, reservoir simulator (340a) is a full reservoir simulation model with increased accuracy, but reduced speed. Reservoir simulator (340b) is a tank model proxy of a reservoir simulator, which typically provides a simplified representation of a reservoir simulation model. This type of reservoir simulator is typically less accurate, but faster to solve. Reservoir simulator (340c) is a lookup table proxy of a reservoir simulator, which is typically even more simplified and faster to solve.

FIG. 6 demonstrates that, depending on the desired analysis, various combinations of one or more simulators may be used to perform the overall simulation. Each may have benefits, and the various outcomes may be compared. In the depicted example, some of the simulations can take more than a week to run once. Thus, one or more of the desired reservoir simulators may be selectively included to provide more immediate outputs that may be compared with the more precise simulations that are generated later.

As further shown in FIG. 6, the wellbore simulators (342a, 342b) and surface network simulator (344) are integrated into the oilfield simulation adjacent the reservoir simulators (340a, 340b, 340c). Surface network simulator (344) is operatively linked to the wellbore simulators (342a, 342b). These wellbore simulators (342a, 342b) and surface network simulator (344) calculate the flow of hydrocarbons in the well and through the surface pipeline surface network (not shown). The simulators are also used to model injection of fluids into the reservoir. As shown, there are different wellbore simulators (342a, 342b) that may be used for the oilfield simulation. The wellbore simulators (342a, 342b) are selectively linked to the reservoir simulators (340a, 340b, 340c) to provide data flow therebetween, as will be described further below.

Like the reservoir simulator (340a, 340b, 340c), wellbore simulator (342a, 342b), and surface network simulator (344), process (346) and/or economics simulator(s) (348) may also be used in the overall oilfield simulation. The process simulator (346) models the activities of, for example, a crude oil & gas processing plant for separation of petroleum into constituent components and creation of sellable products. The process simulator (346) is operatively connected to the surface network simulator (344). Finally, the economics simulator (348) is operatively connected to the process simulator (346). A spreadsheet model may optionally prepare the production data from the process simulator (346) for economic analysis. The economics simulator (348) models the economic evaluation at every time step of an integrated asset model. Although FIG. 6 shows one example of how the economic simulator is connected for performing the integrated simulation, in other examples the economics model can actually be connected to any point in the integrated asset model where oil and gas production forecasts can be generated; from a well in the reservoir simulator, from a well in the network model, from the export node of the network representing the total production of the field, or from separated hydrocarbon component streams in the process plant.

The simulators of FIG. 6 depict the simulators operatively linked for data flow therebetween. The simulators are selectively linked to permit data to flow between the desired simulators. Once linked, the simulators may be configured to share data and/or outputs between the connected simulators. The data and/or outputs received from one simulator may affect the results of other simulators.

The production system may be used to link different parts of oilfield operations, such as the reservoir, wellbore, surface, processing, and economics simulators depicted. The simulators may be cross-platform and/or real-time. One or more simulators may be of similar configurations, or provided by different sources that may cause problems in cross-communication. The simulators, therefore, are linked in a manner that permits operation therebetween. The simulators may be linked, for example, using reservoir to surface coupling and/or stream/variable based couplings. Preferably, these couplings link models together so that the models may solve together over the full simulation timeframe. In some cases, the simulators will initially model separately, in preparation for a full simulation.

The coupling between simulators preferably permits selective passing of data therebetween. In some cases, data flows freely between simulators. In other cases, data flow is restricted or selectively permitted. For example, it may be more time efficient to permit a simulator to complete its simulation process prior to linking to other simulators and receiving additional data therefrom. It may also be desirable to exclude certain simulators if, for example, a defect exists in the simulation.

User inputs may be used to provide constraints, alerts, filters, or other operating parameters for the simulators. Thus, where one simulator indicates that operating conditions are unacceptable, such restrictions may be passed to other simulators to limit the available parameters for the remainder of the oilfield operation.

Simulators are typically linked using couplings, such as generic node/variable couplings or special network couplings. As shown in FIG. 6, generic node/variable couplings (352a, 352b) form connections between wellbore simulators (342a, 342b) and surface network simulator (344), respectively. A generic node/variable coupling (354) forms a connection between surface network simulator (344) and process simulator (346). Another generic node/variable coupling (356) forms a connection between process simulator (346) and economics simulator (348). These types of couplings permit data to flow freely between the simulators. Thus, data from the wellbore, surface, processing, and economics simulators is free to flow therebetween.

In other cases, special network couplings are used to facilitate and/or manipulate the flow of data between the simulators. As shown in FIG. 6, reservoir simulators (340a, 340b) are connected to wellbore simulator (342a) via special network couplings (350a and 350b), respectively. Reservoir simulator (340c) is connected to wellbore simulator (342b) via special network coupling (350c).

The special network coupling (350c), such as implicit or explicit couplings, may be used between the reservoir and wellbore simulators to impose accurate hydraulic response from the network on the reservoir. These couplings permit the coupled simulators to model network equipment, such as gas lift valves, pumps, compressor, and chokes. The couplings may also be configured to permit the coupled simulators to take account of flow assurance issues such as wax and hydrate formation.

An implicit coupling permits simultaneous solution of the coupled simulators. For example, a coupling can be used to provide reservoir and the wellbore governing equations. In some cases, this may be a faster method for performing the simulations, and provide for sharing of data between the simulators. In the example shown in FIG. 6, an implicit coupling between reservoir simulator (340c) and wellbore simulator (342b) provides for simultaneous simulation based on all available data of both simulators.

An explicit coupling may be used to solve reservoir and wellbore governing equations sequentially in an iterative process. With the sequential process, one simulator performs its simulation before the other simulator begins its simulation. In this manner, the first simulator can impose boundary conditions onto the next simulator. In the example shown in FIG. 6, an explicit coupling (350c) between reservoir simulator (340c) and wellbore simulator (342b) indicates that the reservoir simulator completes its simulation prior to linking to wellbore simulator (342b). Thus, wellbore simulator (342b) is impacted by the output of wellbore simulator (340c). In other words, reservoir simulator (340c) imposes boundary conditions on the wellbore simulator. The wellbore is then solved and the reservoir and wellbore pressures and flow rates are compared. If the flows and pressure are within a given tolerance, the reservoir and wellbore simulators are considered balanced.

The selected couplings may also be tight or loose. A tight coupling provides coupling at a Newton level. Consider a reservoir simulation at time $t_0$. In order to progress to time $t_1$ the reservoir material balance equations are solved at each non-linear (Newton) iteration. In order to introduce the effects of the network on the reservoir model (hydraulic response, injection, withdrawal), the network is balanced with the reservoir at a prescribed number of Newtons. For example, where a reservoir simulator is coupled to a wellbore simulator using tight coupling, the system may be balanced using a chosen network balancing method. Reservoir material balance equations are then solved at the first Newton iteration. The wellbore and reservoir simulators are then rebalanced. This process may be repeated as desired.

Tight coupling may be used to balance the reservoir and the wellbore at the end of the timestep. The network may then be modelled in reservoir during the coupling process. This may be used to reduce the effect if well interaction in the reservoir is significant. Depending on the number of Newtons and iterations, tight coupling may require a high number of network balancing iterations.

Loose couplings involve a single reservoir network balance at the start of the timestep. Once a balanced solution has been achieved, the reservoir may complete its timestep without further interaction with the network. This is similar to tight coupling, but with the reservoir simulator initialized to zero. This type of coupling may be used for coupling multiple reservoirs, since two reservoirs may take a different number of Newton iterations to perform the same timestep.

The coupling may be positioned in different locations about the wellbore. For example, the reservoir-wellbore simulator coupling may be a bottom-hole, top-hole, or group coupling. With a bottom-hole coupling, the well completion is modelled in the reservoir model from sandface to bottom hole. The well tubing is modelled in the network. This means that an inflow model in the network well is typically ignored. The bottom hole may be used to provide more well accurate modelling (multiphase flow correlations/pressure traverse), and flow assurance (compositional model/temperature variations). However, the bottom-hole coupling may provide unstable region on well curve that causes convergence issues, involve solving an extra branch per well, require tubing defined in both reservoir and network, and ignore certain completion models.

With top-hole coupling, the well completion and tubing is modelled in the reservoir. The well boundary nodes in the network take account of this. In the case of the wellbore simulator, sources or sinks are used to represent wells. Top-hole coupling typically provides less branches in network model, inexpensive well bore lookup in reservoir, and smoothing in the reservoir VLP curve. However, it may lose resolution in the well bore calculation, and may not be compatible with certain network balancing schemes.

With group coupling, a reservoir well-group representing a production manifold may be coupled to a source in a network. The integrated simulator may set a common top-hole pressure constraint on the wells, and impose a hydraulic response from the network. A large network may be significantly reduced in size, but resolution may be lost in the network simulation.

In some cases, there are constraints on the type of coupling, such as bottom-hole pressure, top-hole pressure, oil rate, water rate, gas rate, liquid rate, reservoir volume rate. During the network balancing process, the reservoir and the network exchange boundary conditions in order to arrive at a converged solution. Once convergence has been achieved, the reservoir may be instructed to continue to the next timestep. At this point, the oilfield simulator may impose constraints on the reservoir wells that reflect the conditions of the converged system.

Other constraints may involve limitations to the simulation. For example, top-hole pressure may not be a valid constraint in the case of bottom hole coupling; holding pressure constant over a long step results may result in a decline in rate and a pessimistic production forecast; holding rate constant over a long timestep may result in a pressure decline. These additional constraints may be included to prevent overly optimistic production forecast, or wells shutting in. While constraints may occur at any coupling, these constraints typically occur along the reservoir/wellbore coupling.

It is desirable to have the oilfield simulator coupled in a manner that will achieve network balancing within a given set of constraints. In some cases, production may begin to decline after a period of steady production. The wells rate control could be imposed in the reservoir as a well or group limit. It could also be imposed in the network as a rate limit on a network branch. After the initial period, the well may start to decline. This could be a result of insufficient oil production potential for the well to produce its requirements. In this case, the reservoir may switch the wells control mode from oil to its next most stringent control mode. This may be another rate control (water/gas) or a pressure limit imposed on the well as a result of network balancing.

One reason for this may be that the system is constrained by reservoir deliverability. In order to produce the daily requirements through the network, the minimum reservoir pressure ($P_W$) may be required to be greater than or equal to the network pressure ($P_N$). As fluid is withdrawn from the reservoir, the reservoir pressure typically declines. When $P_W<P_N$, the network may be cut back in order to increase flow. In such a case, the system is constrained by network deliverability.

Network balancing may be performed to select the optimum operating conditions. Each time a simulator asks the network to solve, it must decide what boundary conditions to pass to the network. The type of network model and the network balancing strategy chosen by the user determine the basis for this decision.

The network type may be automatically determined by the oilfield simulator. The network is determined by considering boundary conditions and additional fluid characterization data that are passed from oilfield simulator to the network. Depending on the type of network, a boundary condition may be specified. For example, black oil production may have a boundary condition for Stock tank rates or Linear IPR (single phase), GOR, and watercut. Compositional production may have a boundary condition for mass rate and mole fractions, or mass IPR, and mole fractions. Water injection may have a boundary condition of stock tank water rate or water injectivity pressure flow relationship. Black oil injection may have a boundary condition of stock tank gas rate or gas injectivity pressure flow relationship. Compositional injection may have a boundary condition of mass rate or mass injectivity pressure flow relationship. Other networks and corresponding boundary conditions may be defined.

The network may have further defined types of couplings, such as rate base, fast PI, chord slope, and obey reserve limits. Rate based coupling is the simplest form of coupling a reservoir to a network. This type of coupling specifies rates in the network and imposes pressure limits on the reservoir. With this type of coupling, the oilfield simulator transfers rate-based boundary conditions to the network.

Based on the integrated simulation method described above, an optimization workflow uses the integrated models that combine the reservoir model with the surface facility network model and the process plant model to define the optimum MWAG cycle or the optimum heavy oil production (e.g., CHOPS) with steam injection.

Figure 7A:
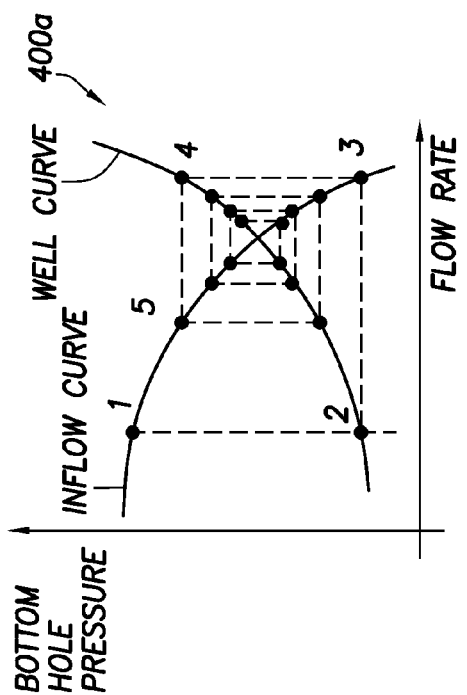
FIGS. 7A and 7B are graphs depicting rate-based coupling that may be used in the oilfield simulator of FIG. 6.

FIG. 7A is a graph (400a) illustrating the case where a reservoir well is coupled to a network well without rate constraint. In this case, the reservoir well should produce up to the pressure limit supplied by the hydraulic response of the network model. This requires the network balancing process to iterate to find the intersection of the reservoir inflow curve and the network well performance curve. To achieve this balancing, the following steps may be performed The reservoir well model is queried for its pressure and flow (P1 and Q1) this give us point 1 on the reservoir inflow curve.

The rate, Q1, is set as the boundary condition to the network, which solves to find point 2—the first point on the well curve.

Pressure P2 is set as a limit in the reservoir well model which is solved to give point 3.

The resulting rate, Q4, is set in the network to find point 4.

This process may be repeated until the reservoir and network pressure and flow values are within a given tolerance.

In FIG. 7A, the rate based balancing process has taken multiple iterations to find a solution. This is because the system is constrained by network backpressure. As a result, the algorithm must home in on the curve intersection (i.e. converge both pressure and flow rate).

Figure 7B:
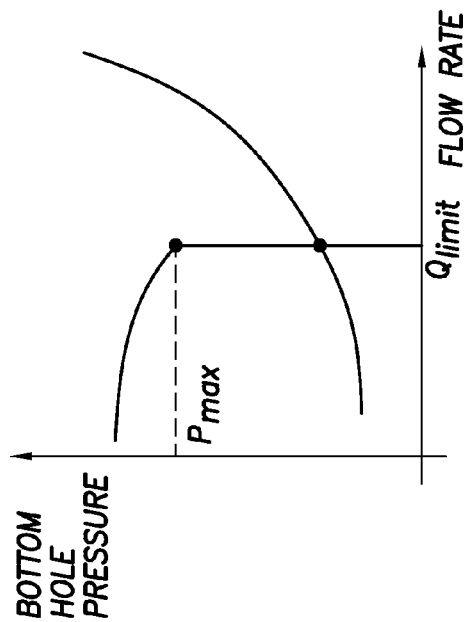

FIG. 7B illustrates a system where the reservoir well coupled to a network well is rate constrained in the reservoir. The reservoir inflow curve is limited to a specific value—$Q_{limit}$. The system operates at this limit as long as the pressure constraint imposed on the well does not exceed a maximum threshold denoted by $P_{max}$.

The rate based coupling algorithm deals with this situation as follows:

The well model is queried for its operations conditions and will return Qlimit and Pmas.

Qlimit is set as a constraint in the network. The network solves are returns a pressure (Pn) and flow (Qn=Qlimit).

As Pn<Pmax, the system is considered to be converged.

The converged system is achieved here in a single iteration. This is because an assumption is made that the positive pressure difference between the reservoir pressure ($P_{max}$) and the network pressure ($P_n$) can be taken up by a network choke.

Figure 8:
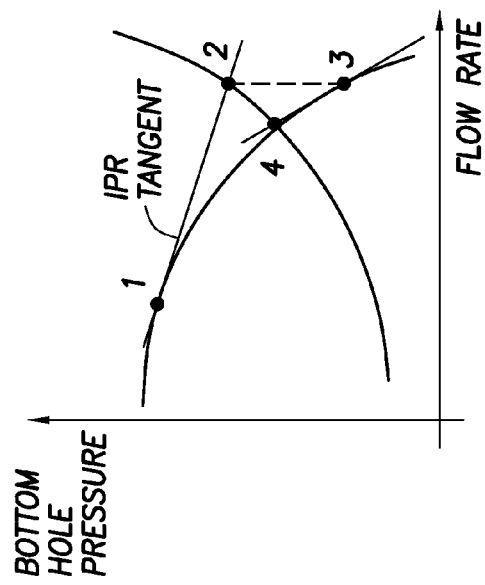
FIG. 8 is a graph depicting a fast PI coupling that may be used in the oilfield simulator of FIG. 6.

FIG. 8 shows how the fast PI method finds a solution. The fast PI method is a non-iterative network balancing process. This coupling has linear IPR's that are specified in the network, and the rate limits are imposed on the reservoir. The network balancing is a three-step process. These steps are:

Query the reservoir for the well linear IPR curve at the current operating point.

Pass the IPR as a boundary condition to the network simulator and solve for network pressure and flow.

Set the flow rate calculated by the network simulator in the reservoir.

The method relies on the network to perform the rate allocation. So any rate limits should be imposed at the network level. Because the balancing algorithm sets rates in the reservoir, existing reservoir rate targets and limits are obeyed. In order to impose flow rate constraints on the system, rate constraints are imposed on the network model.

At the start of the timestep, the linear IPR for the well is queried. This will be the tangent to the well curve at its current operating pressure and flow rate. This IPR is passed to the network, which solves for point 2. The corresponding flow rate is set in the reservoir. This balancing scheme is non-iterative. The rate from the network is taken as the updated operating point. There is no test for convergence. In some cases, material may be balanced, while pressure may not. It may possible to improve the accuracy of this method by performing fast PI balances at multiple Newton iterations, usually if a single reservoir is coupled. The fast PI coupling is non-iterative, and robust. However, it may prohibit reservoir based well management, and may be inaccurate since only rate is balanced.

Figure 9A:
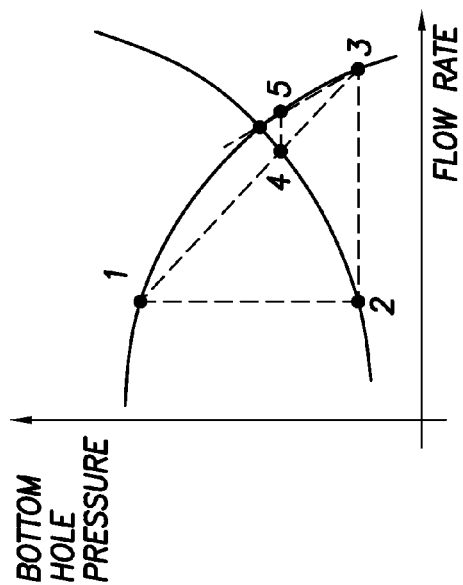
FIGS. 9A, 9B, and 9C are graphs depicting a chord slope coupling that may be used in the oilfield simulator of FIG. 6.
Figure 9B:
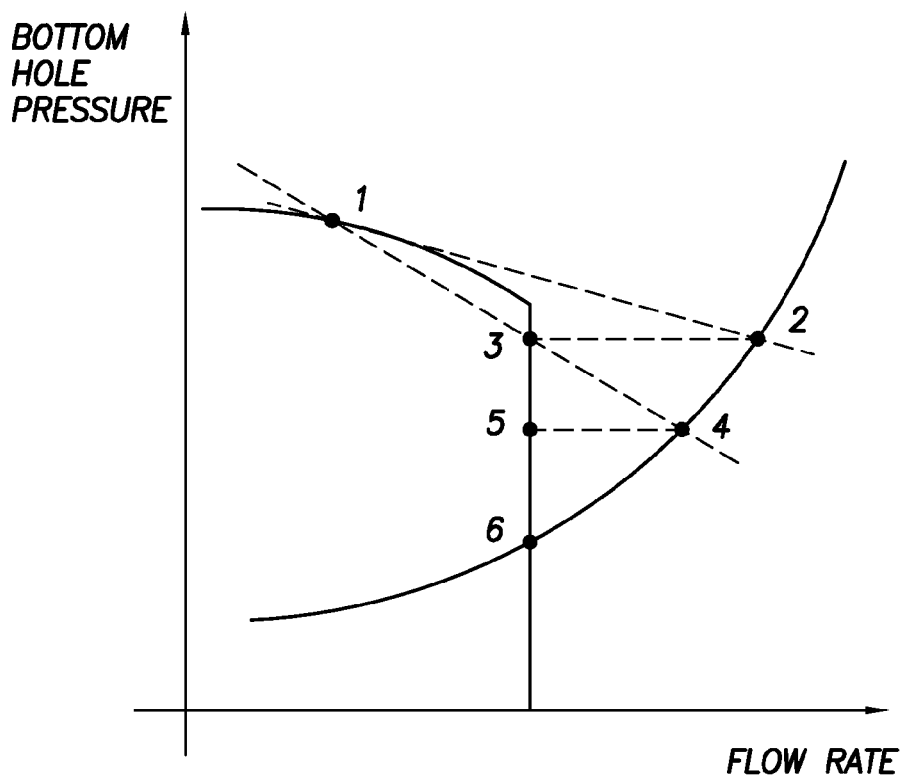
Figure 9C:
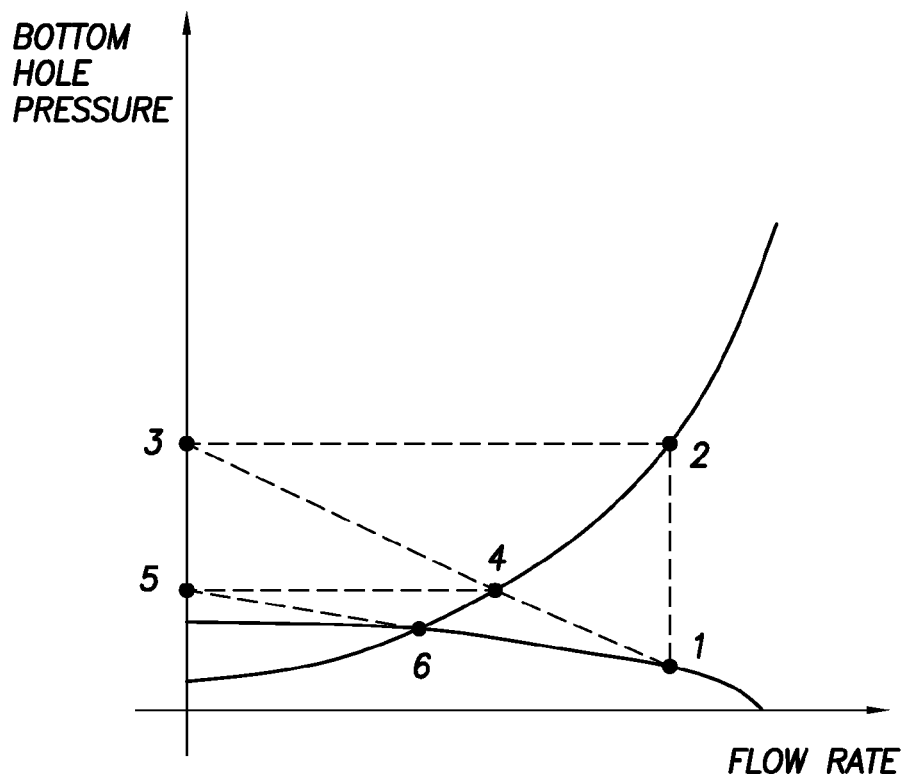

FIGS. 9A, 9B, and 9C contain graphs illustrating the chord slope scheme. The chord slope scheme sets a chord slope of rates and PI taken from the reservoir model in the network. This coupling specifies either rates or IPR's in the network and imposes pressure limits on the reservoir. It aims to work with any pre-existing well and group controls in the reservoir models, as wells as imposing network back pressure.

The algorithm adapts itself to the reservoir by considering the last two operating points on the reservoir IPR. This means that non-linear behavior in the IPR (e.g. effects of skin factors or well/group constraints) can be passed to the network. To obtain information on how the IPR changes, at least two network balancing iterations are typically performed.

FIGS. 9A and 9B consider a coupled reservoir to network simulation with two distinct sets of well management controls. FIG. 9A depicts a Network Constrained System. A reservoir simulation containing 20 wells fed into a common manifold (group). The reservoir wells are coupled to a network model. The wells in the reservoir are controlled on bottom hole pressure (no well or group rate control). The network contains the sink pressure specification and a given sink rate limit. In this case, the wells are controlled by the network back-pressure imposed on the reservoir.

Query the initial operating conditions of the reservoir wells to obtain point 1 on the IPR.

Pass the boundary conditions to the network. This may be:
Rate (shown in figure)
Linear PI Queried from well model The network is solved to obtain point 2 on the well curve.

The network pressure is set in the reservoir.

The well model is solved and queried to return point 3.

A Linear PI is constructed using the last two operating points on the IPR.

The PI is passed to the network that solves to give point 4.

Steps 4 through 7 are repeated until convergence is achieved.

At subsequent timesteps, the boundary condition passed to the network on the first timestep is the PI calculated at the convergence solution at the previous timestep.

FIG. 9B depicts a graph of a Reservoir Constrained System. The wells are controlled using the reservoir group control target limit. Underlying wells operate up to an allocated quantity based on their production potential and the group target. The network models are restricted based on the sink pressure. In this case, the wells are controlled by the reservoir well controls—assuming the reservoir has sufficient pressure to support the flow through the network.

Query the initial operating conditions of the reservoir wells to obtain point 1 on the IPR.
    Pass the boundary conditions to the network. This may be:
        Rate
        Linear PI Queried from well model (shown in figure)
    The network is solved to obtain point 2 on the well curve.
    The network pressure is set in the reservoir.
    The well model is solved and queried to return point 3. Note that this is on the constant rate section of the IPR.
    A Linear PI is constructed using the last two operating points on the IPR.
    The PI is passed to the network that solves to give point 4.
    The resulting network pressure is passed to the reservoir to point 5.
    The algorithm detects that points 3 and 5 have the same flowrate—indicating the well is operating under a rate control imposed by the reservoir.
    The network is specified with a constant rate boundary condition and solved.
    Assuming the reservoir pressure is greater than the network pressure, the well is considered to be converged.

As the reservoir simulation marches through time, withdrawal will result in pressure decline.

FIG. 9C depicts a graph of a wellbore operation with a Reduced Reservoir Pressure. This graph shows a well curve intersecting with an IPR curve, which is significantly flatter than in previous figures. This is meant to illustrate reduced reservoir pressure.

Query the initial operating conditions of the reservoir wells to obtain point 1 on the IPR.
    Set rate based boundary conditions and solve the network. This results in point 2.
    The resulting network pressure is set in the reservoir and the well model is solved to give point 3.
    The reservoir cannot flow at the given pressure and is shut in the reservoir.
    At this point, the Well Revival logic build into the coupling algorithm comes into effect.
        Any wells that have been "temporarily" shut as a result of a network imposed pressure constraint are revived in the reservoir.
        The revival limit may be set by the user to avoid excessive iterations.
        If the revival limit is exceeded, the well is permanently shut in the reservoir.
    A linear PI is constructed using points 1 and 3. This is passed to the network as a boundary condition.
    The network solves and returns point 4.
    The resulting network pressure is set in the reservoir and the well model is solved to give point 5.
    If the flowrates are different, the algorithm will use the last two operating points to construct a PI, or, if they are the same, a constant rate. In the limiting case of no flow, the PI is constructed using the current operating point and the last flowing operating point. In this case, the linear PI is constructed using points 5 and point 1.
    The PI is passed to the network and solved for point 6 where the system reaches convergence.

If may be necessary to perform well revivals until a convergence solution is achieved. This can result in increased run times and, in some case, unnecessary wells shutting. This typically provides accurate, iterate coupling to ensures pressure and rate convergence, and obeys various simulator constraints simultaneously. However, this process is iterative and may be slower. Also, wells may shut in due to insufficient reservoir pressure.

Another coupling configuration that may be used is the obey reservoir limits. This coupling specifies rates in the network, and imposes rate limits in the reservoir. The well management available in the reservoir simulator is extensive. The aim of this method is to allow a reservoir to be coupled to a network with minimal intervention as a result of network constraints. This may be done to ensure that the reservoir well management controls are obeyed whilst avoiding the well shut-in problems, such as those that may occur with the Chord Slope method.

The coupled network may only be pressure specified at the export note. This method does not contain rate constraints. The obey eclipse coupling algorithm work as shown below:

The well model is queried for its operating point.
    Constant rate boundary condition is sent to the network and it is solved.
    If any network well pressures are greater than the respective reservoir well pressure, the well must be cut back.
        A relaxation parameter is calculated for the well based on the difference pressure difference.
        The reservoir well is cut back using the relaxing parameter ($0<r<1$)
    The well model is solved with the new rate.
    Steps 1-4, detailed immediately above, are repeated until no well violate the pressure limit imposed by the network.
    The reservoir continues to the next timestep.

The primary difference between other coupling method and this method is what is set in the reservoir.

Figure 10:
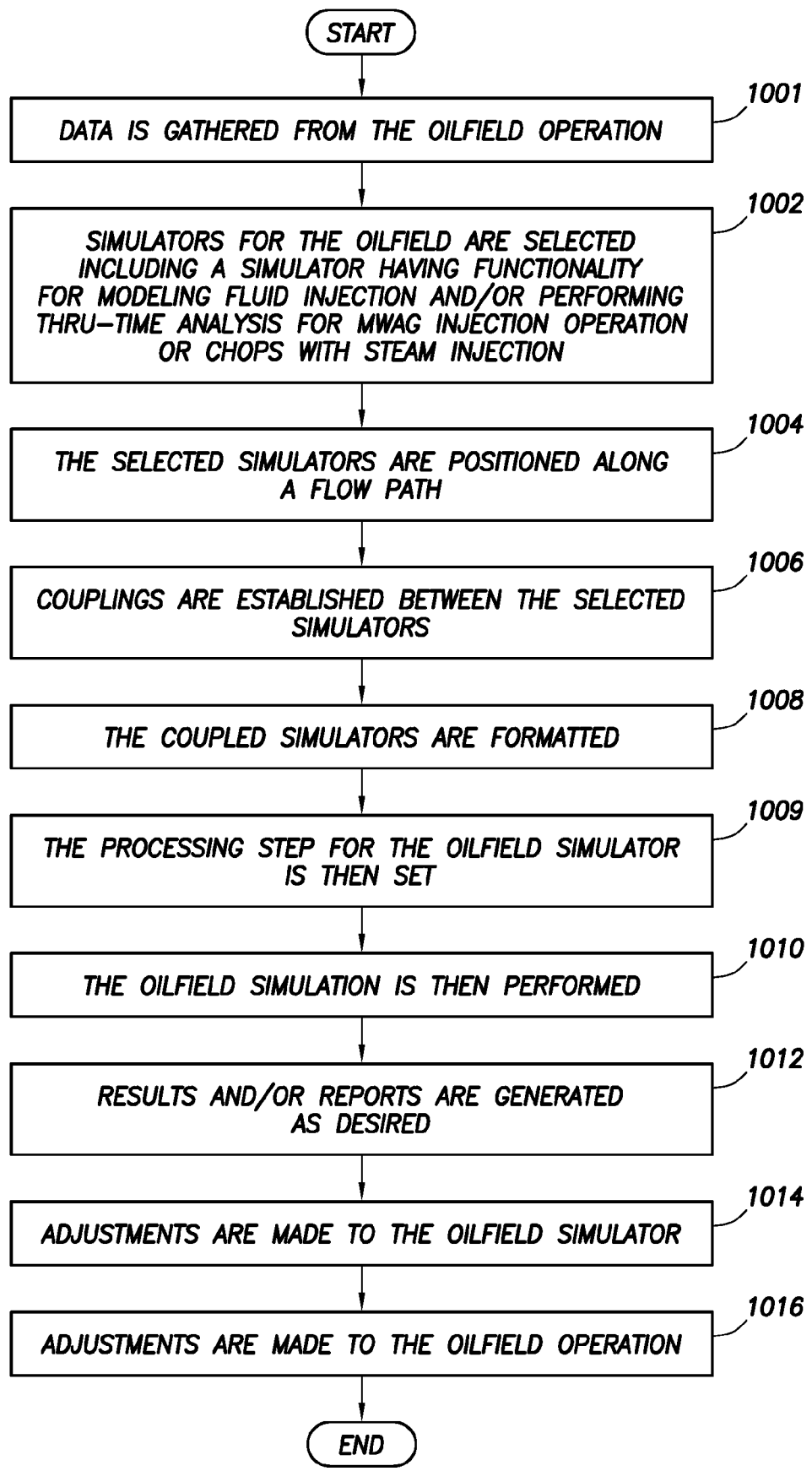
FIG. 10 is a flowchart depicting a method of producing fluid from of the oilfield of FIG. 1.

FIG. 10 depicts a method of producing fluids from an oilfield, such as the oilfield of FIG. 1. This method involves the selective linking of simulators throughout the oilfield to predict and/or control oilfield operations.

Data is gathered from the oilfield operation (Step 1001). In some cases, this data is historical data based on similar oilfield operations, similar geological formations, or applicable scenarios. User inputs may be provided based on known parameters, such as sampling of formation fluid. Data may also be collected from sensors positioned about the oilfield as shown in FIG. 5. Data may be stored in memory and accessed as needed to perform the simulations herein.

The method involves selecting simulators for the oilfield (Step 1002). A variety of simulators may be selected to define the oilfield simulation, such as the reservoir simulators (340a, 340b, 340c), wellbore simulators (342a, 342b), surface network simulator (344), process simulator (346) and economics simulator (348) of FIG. 6. For example, the reservoir simulator (340a) may include functionality to model fluid injection and/or perform thru-time analysis is selected for modeling MWAG injection operation or the heavy oil production (e.g., CHOPS) with steam injection.

The selected simulators are positioned along a flow path (Step 1004). This brings the oilfield simulation into a process flow diagram format as shown in FIG. 6. The connections are preferably established to provide a sequence for the flow of production through the flow diagram. As shown in FIG. 6, the production fluid flows from reservoir simulator, to wellbore simulator, to surface network simulator to process simulator, and to the economics simulator.

Couplings are established between the selected simulators (Step 1006). These couplings are specified according to the type of coupling desired for the specific flow diagram. As shown in FIG. 6, couplings (352a), (352b), (354) and (356) are general node couplings. Couplings (350, 350b, 350c) are special couplings. For example, the coupling may involve coupling a reservoir simulator with functionality to model fluid injection and/or perform thru-time analysis is selected for modeling MWAG injection operation or heavy oil production (e.g., CHOPS) with steam injection.

The coupled simulators are then formatted (Step 1008). For example, the coupled reservoir and wellbore simulators are defined as bottom-hole, top-hole, or grouped couplings. Because the surface network, process and economics simulators are general couplings, no such definition is required.

The processing setup for the oilfield simulator is then set (Step 1009). Setup parameters may include, for example, time frame, frequency, display, etc., and be used to determine, for example, start time, end time, and reporting frequency during simulation runs.

The oilfield simulator is then performed (Step 1010). As shown in the configuration of FIG. 6, the reservoir simulation will solve first. The simulation model and the well/network model iterate until they come to a common solution for the deliverability of each well within a pre-defined tolerance. The results from the network are then sent to the process simulator, which then solves the plant operations defined therein. The economics simulator is then linked to any model that generates a production forecast.

Results and/or reports are generated as desired (Step 1012). As the oilfield simulator runs, status messages and/or results of underlying simulators may be displayed. Interim and/or final results may be selectively generated.

The results may be used to adjust changes in the oilfield simulator, for example, in modeling MWAG injection operation or heavy oil production (e.g., CHOPS) with steam injection (Step 1014). If the simulator is not providing results as desired, or if other data suggests a problem, the simulator may be adjusted. For example, the coupling or constraints defined for the simulation may be altered.

The oilfield operation, for example, the MWAG injection operation or heavy oil production (e.g., CHOPS) with steam injection, may also be adjusted (Step 1016). The simulators may provide information indicating problems at the wellsites that require action. The simulators may also indicate that adjustments in the oilfield operation may be made to improve efficiency, or correct problems. Well management strategy may be adjusted to define different development scenarios to be included in the integrated simulation run.

The steps of portions or all of the process may be repeated as desired. Repeated steps may be selectively performed until satisfactory results achieved. For example, steps may be repeated after adjustments are made. This may be done to update the simulator and/or to determine the impact of changes made.

The data input, coupling, layout, and constraints defined in the simulation provide flexibility to the simulation process. These factors of the various simulators are selected to meet the requirements of the oilfield operation. Any combination of simulators may be selectively linked to create the overall oilfield simulation. The process of linking the simulators may be re-arranged and simulations repeated using different configurations. Depending on the type of coupling and/or the arrangement of simulators, the oilfield simulation may be selected to provide the desired results. Various combinations may be tried and compared to determine the best outcome. Adjustments to the oilfield simulation may be made based on the oilfield, the simulators, the arrangement and other factors. The process may be repeated as desired.

It will be understood from the foregoing description that various modifications and changes may be made in the preferred and alternative embodiments of the present invention without departing from its true spirit. For example, the simulators, couplings and arrangement of the system may be selected to achieve the desired simulation. The simulations may be repeated according to the various configurations, and the results compared and/or analyzed.

This description is intended for purposes of illustration only and should not be construed in a limiting sense. The scope of this invention should be determined only by the language of the claims that follow. The term "comprising" within the claims is intended to mean "including at least" such that the recited listing of elements in a claim are an open group. "A," "an" and other singular terms are intended to include the plural forms thereof unless specifically excluded.

What is claimed is:

1. A method of simulating operations of an oilfield having at least one wellsite, each wellsite having a wellbore penetrating a subterranean formation for extracting fluid from or injecting fluid to an underground reservoir therein, the method comprising:

selecting a plurality of wellsite simulators comprising a wellbore simulator, a surface network simulator, a first reservoir simulator having a full reservoir simulation model, a second reservoir simulator having a tank model proxy of the full reservoir simulation model, and a third reservoir simulator having a lookup table proxy of the full reservoir simulation model;

selecting a plurality of non-wellsite simulators comprising a process simulator and an economic simulator;

establishing a fast productivity index (PI) coupling between the wellbore simulator and a reservoir simulator selected from a group consisting of the first reservoir simulator, the second reservoir simulator, and the third reservoir simulator to impose a hydraulic response between the plurality of wellsite simulators;

establishing a plurality of general node couplings between the process simulator, the economics simulator, and the surface network simulator; and modeling a fluid injection by selectively communicating between the plurality of non-wellsite simulators using at least the plurality of general node couplings and by:
  querying, using the fast PI coupling, the reservoir simulator for a well linear inflow performance relationship (IPR) curve at a current operating point;
  passing, using the fast PI coupling, the well linear IPR curve as a boundary condition to the network simulator to calculate a network pressure and a flow rate; and
  setting, using the fast PI coupling, the flow rate calculated by the network simulator in the reservoir simulator.

2. The method of claim 1, wherein the fluid injection comprises at least one selected from a group consisting of water injection, natural gas injection, polymer injection, steam injection, carbon dioxide injection, surfactant injection, and combinations thereof.

3. The method of claim 1, wherein the plurality of wellsite simulators receives data from sensors positioned about the oilfield, to measure parameters of the oilfield.

4. The method of claim 1, further comprising implementing a plan defined by the plurality of wellsite simulators and the plurality of non-wellsite simulators.

5. The method of claim 4, further comprising modifying the plan based on the modeling of the fluid injection, wherein the plan comprises at least one selected from a group consisting of a Miscible Water Alternating Gas (MWAG) injection schedule, a Thermal Heavy Oil Production with steam injection schedule, and a Cold Heavy Oil Production with Sand (CHOPS) steam injection schedule.

6. The method of claim 1, wherein the fast PI coupling is constrained according to at least one selected from a group consisting of a network constraint, a reservoir constraint, and combinations thereof.

7. A method of simulating operations of an oilfield having at least one wellsite, each wellsite having a wellbore penetrating a subterranean formation for extracting fluid from or injecting fluid to an underground reservoir therein, the method comprising:

selecting a plurality of wellsite simulators comprising a wellbore simulator, a surface network simulator, a first reservoir simulator having a full reservoir simulation model, a second reservoir simulator having a tank model proxy of the full reservoir simulation model, and a third reservoir simulator having a lookup table proxy of the full reservoir simulation model, wherein the plurality of wellsite simulators have functionality to perform a thru-time dynamic modeling of an injection operation comprising at least one selected from a group consisting of a Miscible Water Alternating Gas (MWAG) injection, a Thermal Heavy Oil Production with steam injection, and a Cold Heavy Oil Production with Sand (CHOPS) with steam injection;

selecting a plurality of non-wellsite simulators comprising a process simulator and an economic simulator;

establishing a fast productivity index (PI) coupling between the wellbore simulator and a reservoir simulator selected from a group consisting of the first reservoir simulator, the second reservoir simulator, and the third reservoir simulator to impose a hydraulic response between the plurality of wellsite simulators;

establishing a plurality of general node couplings between the process simulator, the economics simulator, and the surface network simulator; and performing the thru-time dynamic modeling of the injection operation by selectively communicating between the plurality of non-wellsite simulators using at least the plurality of general node couplings and by:

querying, using the fast PI coupling, the reservoir simulator for a well linear inflow performance relationship (IPR) curve at a current operating point;

passing, using the fast PI coupling, the well linear IPR curve as a boundary condition to the network simulator to calculate a network pressure and a flow rate; and setting, using the fast PI coupling, the flow rate calculated by the network simulator in the reservoir simulator.

8. The method of claim 7, wherein the injection operation comprises at least one selected from a group consisting of water injection, natural gas injection, polymer injection, steam injection, carbon dioxide injection, surfactant injection, and combinations thereof.

9. The method of claim 7, wherein the plurality of wellsite simulators receives data from sensors positioned about the oilfield, to measure parameters of the oilfield.

10. The method of claim 7, further comprising implementing a plan defined by the plurality of wellsite simulators and the plurality of non-wellsite simulators.

11. The method of claim 10, further comprising modifying the plan based on the thru-time dynamic modeling of the injection operation, wherein the plan comprises a MWAG injection schedule, a Thermal Heavy Oil Production with steam injection, and a CHOPS with steam injection.

12. The method of claim 7, wherein the fast PI coupling is constrained according to at least one selected from a group consisting of a network constraint, a reservoir constraint, and combinations thereof.

13. A non-transitory computer readable medium, embodying instructions executable by a computer to perform method steps for modeling a fluid injection operation of an oilfield having a subterranean formation with at least one reservoir positioned therein, the instructions comprising functionality to:

select a plurality of wellsite simulators comprising a wellbore simulator, a surface network simulator, a first reservoir simulator having a full reservoir simulation model, a second reservoir simulator having a tank model proxy of the full reservoir simulation model, and a third reservoir simulator having a lookup table proxy of the full reservoir simulation model;

select a plurality of non-wellsite simulators comprising a process simulator and an economic simulator;

establish a fast productivity index (PI) coupling between the wellbore simulator and a reservoir simulator selected from a group consisting of the first reservoir simulator, the second reservoir simulator, and the third reservoir simulator to impose a hydraulic response between the plurality of wellsite simulators;

establish a plurality of general node couplings between the process simulator, the economics simulator, and the surface network simulator; and model a fluid injection by selectively communicating between the plurality of non-wellsite simulators using at least the plurality of general node couplings and by:

querying, using the fast PI coupling, the reservoir simulator for a well linear inflow performance relationship (IPR) curve at a current operating point;

passing, using the fast PI coupling, the well linear IPR curve as a boundary condition to the network simulator to calculate a network pressure and a flow rate; and setting, using the fast PI coupling, the flow rate calculated by the network simulator in the reservoir simulator.

14. A non-transitory computer readable medium, embodying instructions executable by a computer to perform method steps for thru-time dynamic modeling of an oilfield having a subterranean formation with at least one reservoir positioned therein, the instructions comprising functionality to:

select a plurality of wellsite simulators comprising a wellbore simulator, a surface network simulator, a first reservoir simulator having a full reservoir simulation model, a second reservoir simulator having a tank model proxy of the full reservoir simulation model, and a third reservoir simulator having a lookup table proxy of the full reservoir simulation model, wherein the plurality of wellsite simulators have functionality to perform a thru-time dynamic modeling of an injection operation comprising at least one selected from a group consisting of a Miscible Water Alternating Gas (MWAG) injection, a Thermal Heavy Oil Production with steam injection, and a Cold Heavy Oil Production with Sand (CHOPS) with steam injection;

select a plurality of non-wellsite simulators comprising a process simulator and an economic simulator;

establish a fast productivity index (PI) coupling between the wellbore simulator and a reservoir simulator selected from a group consisting of the first reservoir simulator, the second reservoir simulator, and the third reservoir simulator to impose a hydraulic response between the plurality of wellsite simulators;

establish a plurality of general node couplings between the process simulator, the economics simulator, and the surface network simulator; and perform the thru-time dynamic modeling of the injection operation by selectively communicating between the plurality of non-wellsite simulators using at least the plurality of general node couplings and by:

querying, using the fast PI coupling, the reservoir simulator for a well linear inflow performance relationship (IPR) curve at a current operating point;

passing, using the fast PI coupling, the well linear IPR curve as a boundary condition to the network simulator to calculate a network pressure and a flow rate; and setting, using the fast PI coupling, the flow rate calculated by the network simulator in the reservoir simulator.

* * * * *